(12) United States Patent
Ishida et al.

(10) Patent No.: US 8,253,240 B2
(45) Date of Patent: Aug. 28, 2012

(54) CAP MEMBER AND SEMICONDUCTOR DEVICE EMPLOYING SAME

(75) Inventors: Masaya Ishida, Mihara (JP); Daisuke Hanaoka, Kyoto (JP); Takeshi Horiguchi, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 219 days.

(21) Appl. No.: 12/292,672

(22) Filed: Nov. 24, 2008

(65) Prior Publication Data
US 2009/0140416 A1     Jun. 4, 2009

(30) Foreign Application Priority Data

Nov. 29, 2007 (JP) ................................. 2007-309425

(51) Int. Cl.
*H01L 23/12* (2006.01)
(52) U.S. Cl. .................... 257/704; 362/800; 313/498
(58) Field of Classification Search .................. 257/704; 313/498; 362/800
See application file for complete search history.

(56) References Cited

U.S. PATENT DOCUMENTS

| | | | |
|---|---|---|---|
| 5,296,724 A * | 3/1994 | Ogata et al. .................... | 257/98 |
| 5,867,985 A | 2/1999 | Furuhashi et al. | |
| 5,878,069 A * | 3/1999 | Kamibayashi et al. ......... | 372/36 |
| 6,785,053 B2 * | 8/2004 | Savage, Jr. .................... | 359/642 |
| 7,176,436 B2 * | 2/2007 | Zheng et al. .............. | 250/214 R |
| 2003/0067950 A1 * | 4/2003 | Hanaoka ......................... | 372/34 |
| 2006/0034072 A1 * | 2/2006 | Shih .............................. | 362/157 |
| 2006/0068516 A1 | 3/2006 | Hanaoka et al. | |

FOREIGN PATENT DOCUMENTS

| | | |
|---|---|---|
| CN | 200620017969 | 10/2007 |
| JP | 61-080840 | 4/1986 |
| JP | 61-108189 | 5/1986 |
| JP | 02-098986 A | 4/1990 |
| JP | 04-033779 A | 2/1992 |
| JP | 04-305989 | 10/1992 |
| JP | 10-026037 A | 1/1998 |
| JP | 2005-101481 | 4/2005 |
| JP | 2006-186166 | 7/2006 |

* cited by examiner

*Primary Examiner* — Thao Le
*Assistant Examiner* — Geoffrey Ida
(74) *Attorney, Agent, or Firm* — Harness, Dickey & Pierce, P.L.C.

(57) ABSTRACT

A cap member capable of alleviating degradation of reliability and improving fabrication yields is provided. The cap member has a cylindrical side wall portion, a top face portion closing one end of the side wall portion and having a light exit hole formed therein to allow extraction of laser light from a semiconductor laser chip; a light transmission window fitted to the top face portion to stop the light exit hole, and a flange portion arranged at the other end of the side wall portion and welded on the upper face of a stem on which the semiconductor laser chip is mounted. A groove portion is formed in an inner surface of the top face portion, and this groove portion makes part of the top face portion in a predetermined region less thick than the other part thereof.

15 Claims, 24 Drawing Sheets

COMPARATIVE EXAMPLE

COMPARATIVE EXAMPLE

CAP MEMBER AND SEMICONDUCTOR DEVICE EMPLOYING SAME

This nonprovisional application claims priority under 35 U.S.C. §119(a) on Patent Application No. 2007-309425 filed in Japan on Nov. 29, 2007, the entire contents of which are hereby incorporated by reference.

BACKGROUND OF THE INVENTION

1. Field of the Invention

The present invention relates to a cap member for covering a semiconductor chip, and to a semiconductor device employing such a cap member.

2. Description of Related Art

As one type of package for semiconductor laser chips (semiconductor chips) for use in optical pickup devices or the like, there are conventionally known can-package-type semiconductor laser devices (semiconductor devices) in which a semiconductor laser chip is sealed in a metal cap member. Depending on the kind of semiconductor laser chip incorporated in them, some of such can-package type semiconductor laser devices have semiconductor laser chips sealed airtightly in cap members as just mentioned. For example, with nitride-based semiconductor laser chips, when they are driven in the atmosphere, dust may adhere to their laser light exit part, or an organic substance may burn onto their laser light exit part, inconveniently resulting in degraded characteristics. For this reason, nitride-based semiconductor laser chips are generally incorporated in a can package, in a state airtightly sealed in it, when used as light sources in optical pickup devices or the like.

A cap member for sealing a semiconductor laser chip in has formed therein an opening through which to extract laser light. To a rim portion of the opening in the cap member, a light transmission window formed of glass is airtightly fitted by use of low-melting-point glass so as to stop the opening. Such a structure of a cap member is disclosed in, for example, JP-A-2005-101481.

On the other hand, with the recent trend for downsizing and slimming down electronic devices such as notebook-type personal computers, with a view to incorporating into such electronic devices optical disc drives including optical pickup devices, there is demand for slimming down optical disc drives. Concurrent with this trend, there is demand for downsizing can-package-type semiconductor laser devices for use as light sources in optical pickup devices.

However, downsizing can-package-type semiconductor laser devices leads, inconveniently, to degraded heat-dissipation characteristics. With degraded heat-dissipation characteristics, less of the heat generated when a semiconductor laser chip is driven is dissipated, resulting in a higher chip temperature of the semiconductor laser chip. Since this degrades the chip characteristics and reliability of the semiconductor laser chip, an improvement in heat-dissipation characteristic is desired.

Against this background, there is conventionally known a structure of a can-package-type semiconductor laser device that allows an improvement in heat-dissipation characteristics even in the face of downsizing. FIG. 45 is a sectional view illustrating a structure of a conventionally known can-package-type semiconductor laser device. As shown in FIG. 45, the conventionally known can-package-type semiconductor laser device is provided with a stem 3001, a block portion 3002 provided on the stem 3001, a semiconductor laser chip 3004 fitted via a sub-mount 3003 on a side face of the block portion 3002, lead pins 3005 for supplying electric power to the semiconductor laser chip 3004, and a cap member 3100 for airtightly sealing the semiconductor laser chip 3004 in. In this can-package-type semiconductor laser device, with a view to improving heat-dissipation characteristics, the block portion 3002 on which the semiconductor laser chip 3004 is mounted is formed as large as possible. That is, the block portion 3002 functions as a heat sink, and forming this block portion 3002 as large as possible ensures the desired heat dissipation.

The cap member 3100 is formed by press-working of a metal sheet, and includes a cylindrical side wall portion 3101, a top face portion 3102 provided at one end of the side wall portion 3101, and a flange portion 3103 provided at the other end of the side wall portion 3101. In the top face portion 3102 of the cap member 3100, an opening 3102a through which to extract laser light is provided, and the opening 3102a of the cap member 3100 is covered by a light transmission window 3104 to thereby seal the semiconductor laser chip 3004 airtightly in. The light transmission window 3104 is fitted to the cap member 3100 by use of low-melting-point glass 3105.

On the other hand, the flange portion 3103 of the cap member 3100 is formed at the other end of the cylindrical side wall portion 3101 as a result of the metal sheet being bent outward of the side wall portion 3101 with a predetermined radius of curvature. The flange portion 3103 is welded to the upper face of the stem 3001, and as a result the cap member 3100 is fixed to the upper face of the stem 3001 so as to cover the semiconductor laser chip 3004 and the block portion 3002.

Here, in the can-package-type semiconductor laser device shown in FIG. 45, with a view to improving heat-dissipation characteristics, the block portion 3002 is formed as large as possible, and accordingly the diameter D of the cap member 3100 covering the block portion 3002 is made as large as possible, so as to be large enough to cover the block portion 3002.

FIG. 46 is a sectional view illustrating a method for fixing the cap member on the stem in the can-package-type semiconductor laser device shown in FIG. 45. Now, with reference to FIG. 46, the method for fixing the cap member 3100 on the stem 3001 will be described. First, the cap member 3100 is put on the upper face of the stem 3001 so as to cover the block portion 3002 and the semiconductor laser chip 3004. Next, a second electrode 3300 is put in contact with the lower face of the stem 3001, and in addition a first electrode 3200 is moved toward the stem 3001 (in FIG. 46, in the direction of arrow S) so that the first electrode 3200 presses the flange portion 3103 of the cap member 3100 onto the upper face of the stem 3001. Then electric current is passed between the first electrode 3200 and the second electrode 3300. This causes part of the flange portion 3103 to melt under the heat due to electrical resistance, and as a result the flange portion 3103 of the cap member 3100 is welded on the upper face of the stem 3001. In this way, the semiconductor laser chip 3004 is sealed airtightly in the cap member 3100.

However, in the can-package-type semiconductor laser device shown in FIG. 45, as a result of the diameter D of the cap member 3100 being made as large as possible, the distance b from the outer surface of the side wall portion 3101 to one end of the flange portion 3103 is small. Thus, when the first electrode 3200 (see FIG. 46) presses the flange portion 3103 of the cap member 3100 onto the upper face of the stem 3001, inconveniently, the part bent at the predetermined radius of curvature—called the curved-surfaced part (round part) 3106—is pressed. As a result, when the first electrode 3200 presses the flange portion 3103, inconveniently, a force is applied also to a part other than the flange portion 3103, namely also to the side wall portion 3101 and the top face portion 3102.

Since the low-melting-point glass 3105 by use of which the light transmission window 3104 is airtightly fitted is relatively brittle, if a force is applied to the side wall portion 3101 and the top face portion 3102 of the cap member 3100, inconveniently, the force may break the low-melting-point glass 3105, causing the light transmission window 3104 to drop off, or may develop a crack in the low-melting-point glass 3105. This causes the can package to lose airtightness, and thus degrades the chip characteristics etc. of the semiconductor laser chip 3004. Thus the conventional can-package-type semiconductor laser device described above has the problems of low reliability and low fabrication yields.

Incidentally, even if, when the first electrode 3200 presses the flange portion 3103, the low-melting-point glass 3105 does not break, or does not develop a crack, stress remains in the cap member 3100. As a result, when an external force is applied to the cap member 3100 with such stress remaining in it, inconveniently, the low-melting-point glass 3105 easily breaks, or easily develops a crack.

On the other hand, in can-package-type semiconductor laser devices with common package sizes, such as those with stem exterior diameters of 9 mm, 5.6 mm, etc, as distinct from the can-package-type semiconductor laser device shown in FIG. 45, a sufficiently long distance is secured from the outer surface of the side wall portion of the cap member to one end of the flange portion. Thus, when the cap member is welded on the upper face of the stem, as compared with the can-package-type semiconductor laser device shown in FIG. 45, a force is less likely to be applied to the side wall portion and the top face portion of the cap member. Accordingly, when the cap member is welded, the low-melting-point glass by use of which the light transmission window is airtightly fitted is less likely to break or develop a crack.

Inconveniently, however, since the low-melting-point glass by use of which the light transmission window is airtightly fitted is brittle as described above, if an external force is applied to the cap member, even in can-package-type semiconductor laser devices with common package sizes as mentioned above, inconveniently, the low-melting-point glass may break, causing the light transmission window to drop off, or may develop a crack. This results in the problems of low reliability and low fabrication yields of products (can-package-type semiconductor laser devices).

SUMMARY OF THE INVENTION

The present invention has been devised to solve the problems mentioned above, and it is an object of the present invention to provide a cap member that can alleviate degradation of reliability and that can improve fabrication yields.

It is another object of the present invention to provide a semiconductor device with high reliability.

To achieve the above objects, according to a first aspect of the invention, a cap member includes: a cylindrical side wall portion; a top face portion that closes one end of the side wall portion and that has an opening formed in a predetermined region therein; a window member that is fitted to the top face portion so as to stop the opening; and a fitting portion that is arranged at another end of the side wall portion and that is fixed on a support base on which a semiconductor chip is mounted. Here, at least one of the side wall portion and the top face portion has part thereof, at one or more places, formed to be less thick than another part thereof.

In the cap member according to the first aspect, as described above, at least one of the side wall portion and the top face portion has part thereof, at one or more places, formed to be less thick than another part thereof. Thus, if, when the cap member is fixed (welded), a force is applied to the side wall portion and the top face portion of the cap member, the force can be alleviated by the less-thick part provided in the cap member. As a result, even in a case where the window member that stops the opening in the top face portion is airtightly fitted by use of relatively brittle low-melting-point glass, it is possible to alleviate application (transmission) of a force to the low-melting-point glass. That is, the less-thick part deforms more easily than the other part, and thus, when a force is applied to the cap member, the less-thick part deforms and thereby makes it less easy for the force to be transmitted to the low-melting-point glass. In this way, it is possible to alleviate the inconvenience of the low-melting-point glass breaking and causing the window member to drop off, or the low-melting-point glass developing a crack. Accordingly, by building a semiconductor device by use of this cap member, it is possible to improve the fabrication yield of the semiconductor device. Moreover, since it is possible to alleviate loss of airtightness of the semiconductor device, it is possible to alleviate degradation of reliability.

Moreover, in the cap member according to the first aspect, with the structure described above, even if, after the cap member is fixed (welded), an external force is applied to the cap member, the less-thick part provided in the cap member can alleviate the external force applied to the cap member. In this way, it is possible to alleviate application (transmission) of a force to the low-melting-point glass; thus, even in such a case, it is possible to alleviate the inconvenience of the low-melting-point glass by use of which the window member is airtightly fitted breaking, or the low-melting-point glass developing a crack.

In the above-described cap member according to the first aspect, preferably, the top face portion has a first step portion formed in at least part of a rim portion of the opening, and the first step portion forms the less-thick part in the top face portion. With this structure, part of the top face portion can be easily formed to be less thick than the other part thereof. Thus, even if a force is applied to the cap member, it is possible to easily alleviate the inconvenience of the low-melting-point glass breaking and causing the window member to drop off, or the low-melting-point glass developing a crack.

In this case, preferably, the opening in the top face portion is formed circular as seen in a plan view, and the first step portion is formed all around the rim portion of the opening. With this structure, it is possible to more easily alleviate the inconvenience of the low-melting-point glass breaking and causing the window member to drop off, or the low-melting-point glass developing a crack.

In the above-described cap member according to the first aspect, a first groove portion may be formed in the predetermined region in the top face portion so that the first groove portion forms the less-thick part in the top face portion. With this structure, part of the top face portion can be easily formed to be less thick than the other part thereof. Thus, even if a force is applied to the cap member, it is possible to easily alleviate the inconvenience of the low-melting-point glass breaking and causing the window member to drop off, or the low-melting-point glass developing a crack. Thus it is possible to easily alleviate degradation of reliability and improve fabrication yields.

In the above-described structure in which a first groove portion is formed in the top face portion, preferably, the first groove portion is formed circumferentially so as to surround the opening as seen in a plan view. With this structure, it is possible to more easily alleviate the inconvenience of the low-melting-point glass breaking and causing the window member to drop off, or the low-melting-point glass developing a crack.

In the above-described structure in which a first groove portion is formed in the top face portion, the first groove portion may be formed in one of the inner and outer surfaces of the top face portion.

In the above-described structure in which a first groove portion is formed in the top face portion, the first groove portion may be formed in both of the inner and outer surfaces of the top face portion.

In the above-described cap member according to the first aspect, preferably, a second step portion is formed in a predetermined region in the side wall portion, and the second step portion forms the less-thick part in the side wall portion. With this structure, part of the side wall portion can be easily formed to be less thick than the other part thereof. Thus, even if a force is applied to the cap member, it is possible to easily alleviate the inconvenience of the low-melting-point glass breaking and causing the window member to drop off, or the low-melting-point glass developing a crack.

In this case, preferably, the second step portion is formed so as to make one turn in the circumferential direction of the side wall portion. With this structure, it is possible to more easily alleviate the inconvenience of the low-melting-point glass breaking and causing the window member to drop off, or the low-melting-point glass developing a crack.

In the above-described structure in which a second step portion is formed in the side wall portion, the second step portion may be formed at two or more places in the side wall portion.

In the above-described cap member according to the first aspect, preferably, a second groove portion is formed in a predetermined region in the side wall portion, and the second groove portion forms the less-thick part in the side wall portion. With this structure, part of the side wall portion can be easily formed to be less thick than the other part thereof. Thus, even if a force is applied to the cap member, it is possible to easily alleviate the inconvenience of the low-melting-point glass breaking and causing the window member to drop off, or the low-melting-point glass developing a crack.

In this case, preferably, the second groove portion is formed so as to make one turn in the circumferential direction of the side wall portion. With this structure, it is possible to more easily alleviate the inconvenience of the low-melting-point glass breaking and causing the window member to drop off, or the low-melting-point glass developing a crack.

In the above-described structure in which a second groove portion is formed in the side wall portion, the second groove portion may be formed at two or more places in the side wall portion.

In the above-described structure in which a second groove portion is formed in the side wall portion, the second groove portion may be formed in one of the inner and outer surfaces of the side face portion.

In the above-described structure in which a second groove portion is formed in the side wall portion, the second groove portion may be formed in both of the inner and outer surfaces of the side face portion.

The second groove portion formed in the side wall portion may be linear in shape, or may be given any other shape. For example, it may have a strip-shaped trough with a predetermined or larger width, and may have interior and exterior diameters in two or more steps in the side wall portion. In a case where the second groove portion is formed to have interior and exterior diameters in two or more steps, it is possible to more easily alleviate the inconvenience of the low-melting-point glass breaking and causing the window member to drop off, or the low-melting-point glass developing a crack.

In the above-described cap member according to the first aspect, preferably, the fitting portion is formed at the other end of the side wall portion integrally therewith, and has a projecting portion formed thereon, with the projecting portion projecting toward the support base and pressed onto the upper face of the support base; the fitting portion is bent outward of the cylindrical side wall portion with a predetermined radius of curvature so that the fitting portion includes a flat-surfaced portion; and the projecting portion is formed on the flat-surfaced portion. With this structure, even when the fitting portion is pressed with an electrode or the like for the purpose of welding the cap member on the upper face of the support base, it is possible to press the projecting portion, which will be welded, onto the upper face of the support base in good condition. Thus, when the cap member is fixed (welded), it is possible to alleviate application of a force to a part other than the fitting portion, namely to the side wall portion and the top face portion. It is thereby possible to effectively alleviate the inconvenience of the low-melting-point glass breaking and causing the window member to drop off, or the low-melting-point glass developing a crack.

In this case, preferably, the projecting portion is formed on the fitting portion, in an end portion thereof opposite from the side wall portion. With this structure, the projecting portion can be easily formed on the flat-surfaced portion of the fitting portion; thus it is possible to easily press the projecting portion onto the upper face of the support base in good condition. It is thereby possible to more effectively alleviate the inconvenience of the low-melting-point glass breaking and causing the window member to drop off, or the low-melting-point glass developing a crack.

According to a second aspect of the present invention, a semiconductor device includes: a semiconductor chip; a support base on which the semiconductor chip is mounted; and the cap member according to the first aspect described above. Here, the cap member is fixed on the support base so as to cover the semiconductor chip. With this structure, it is possible to easily alleviate degradation of the reliability of the semiconductor laser device and improve the fabrication yield of the semiconductor device In the above-described semiconductor device according to the second aspect, fixing the cap member on the support base permits the semiconductor chip to be airtightly sealed in the cap member easily.

In the above-described semiconductor device according to the second aspect, preferably, the semiconductor chip is a nitride-based semiconductor laser chip. With this structure, it is possible to easily obtain a nitride-based semiconductor laser device that can alleviate degradation of chip characteristics and degradation of reliability.

In the above-described semiconductor device according to the second aspect, preferably, the support base is substantially circular as seen in a plan view, and the support base has a diameter of 3.8 mm or less. By applying this structure to the semiconductor device according to the second aspect described above, it is possible to easily obtain a compact package (compact semiconductor device) with high reliability. This makes it possible to easily cope with downsizing of semiconductor devices. Examples of semiconductor devices in which the support base has a diameter of 3.8 mm or less include semiconductor devices (packages) with such package sizes that the support base has a diameter of 3.8 mm, 3.3 mm, etc.

As described above, according to the present invention, it is possible to easily obtain a cap member that can alleviate degradation of reliability and that can improve fabrication yields.

According to the present invention, it is also possible to easily obtain a semiconductor device with high reliability.

DETAILED DESCRIPTION OF PREFERRED EMBODIMENTS

Hereinafter, embodiments of the present invention will be described in detail with reference to the drawings. The embodiments described below deal with a case in which the invention is applied to a can-package-type semiconductor laser device as one example of a semiconductor device according to the invention. The following description deals with a semiconductor device with a package size of 3.3 mm in diameter.

First Embodiment

Figure 1:
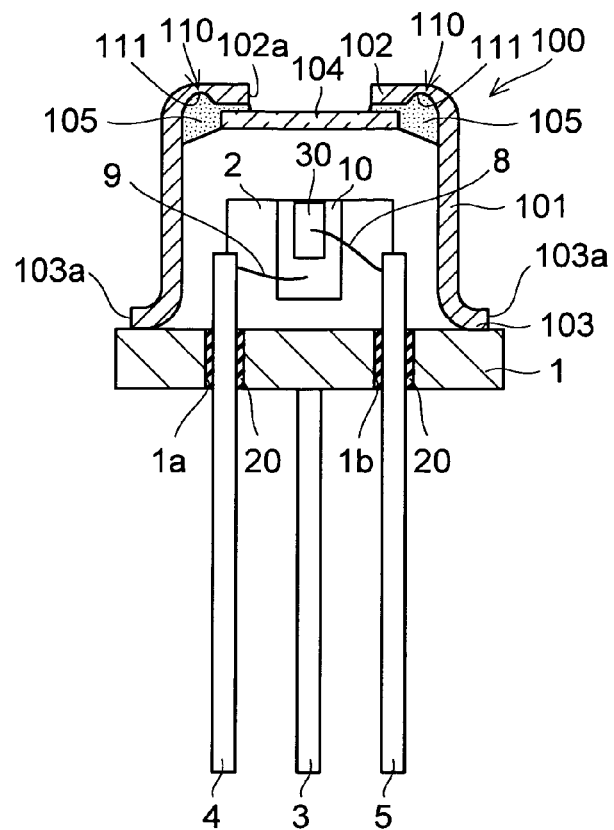
FIG. 1 is a sectional view of a semiconductor laser device according to a first embodiment of the invention.
Figure 2:
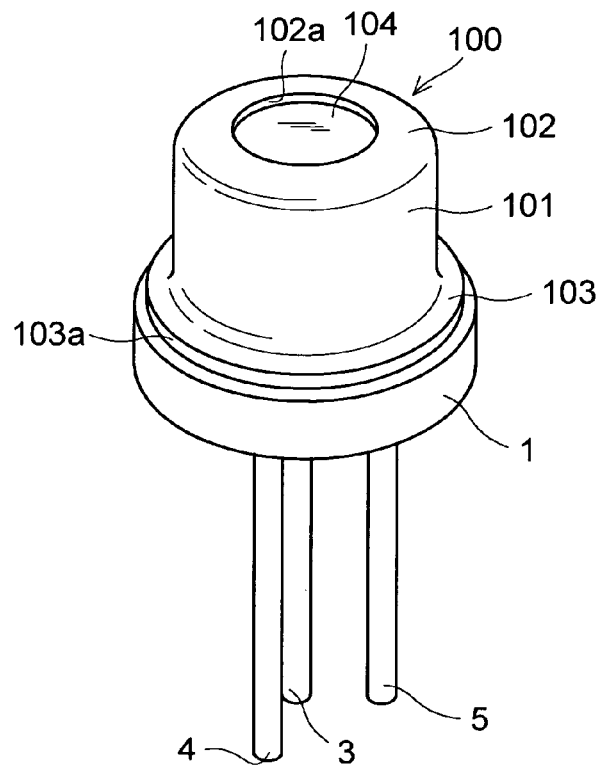
FIG. 2 is an overall perspective view of the semiconductor laser device according to the first embodiment of the invention.
Figure 3:
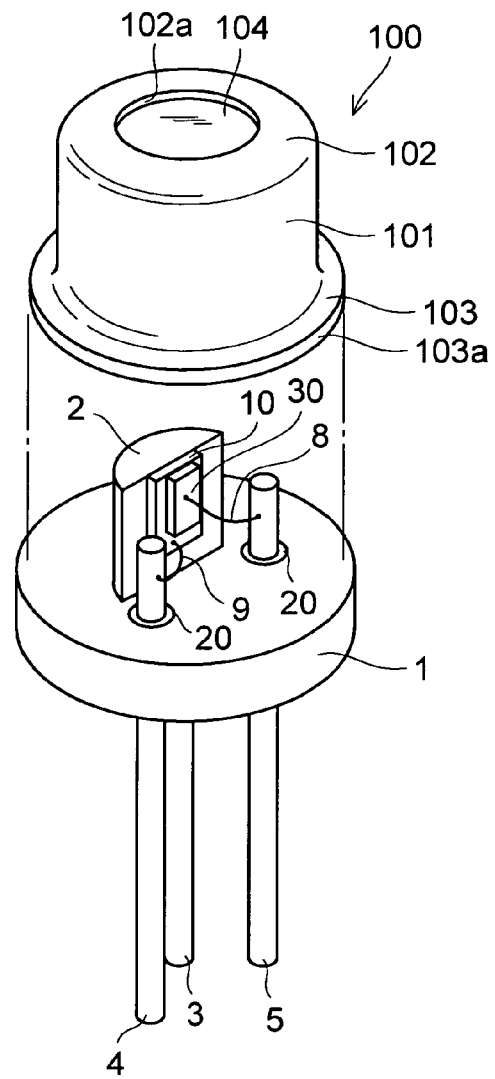
FIG. 3 is an exploded perspective view of the semiconductor laser device according to the first embodiment of the invention.

FIG. 1 is a sectional view of a semiconductor laser device according to a first embodiment of the invention. FIG. 2 is an overall perspective view of the semiconductor laser device according to the first embodiment of the invention. FIG. 3 is an exploded perspective view of the semiconductor laser device according to the first embodiment of the invention. FIGS. 4 to 8 are diagrams illustrating a structure of the semiconductor laser device according to the first embodiment of the invention. First, with reference to FIGS. 1 to 8, a structure of the semiconductor laser device according to the first embodiment of the invention will be described.

The semiconductor laser device according to the first embodiment has a can-package type structure; as shown in FIGS. 1 to 3, it is provided with a stem 1, a block portion 2 (see FIGS. 1 and 3) provided on the upper face of the stem 1, a sub-mount 10 fitted to a side face of the block portion 2, a semiconductor laser chip 30 mounted on the sub-mount 10, a cap member 100 welded (fixed) on the upper face of the stem 1 so as to cover the semiconductor laser chip 30 etc., and three lead pins 3, 4, and 5. The stem 1 is an example of a "support base" according to the invention, and the semiconductor laser chip 30 is an example of a "semiconductor chip" according to the invention.

The stem 1 is formed of a metal material such as copper or iron, and is formed, as shown in FIG. 3, in the shape of a disk. The exterior diameter of the stem 1 is 3.3 mm, and the surface of the stem 1 is plated with, for example, gold. On the upper face of the stem 1, the block portion 2 is provided that functions as a heat sink for dissipating the heat generated in the semiconductor laser chip 30. The block portion 2 is formed of the same material as the stem 1, and is formed integrally with the stem 1. To secure the desired heat dissipation, the block portion 2 is formed as large as possible. The surface of the block portion 2 also is plated with, for example, gold. Moreover, as shown in FIGS. 1 and 3, in predetermined regions in the stem 1, through holes 1a and 1b are formed through which the lead pins 4 and 5, respectively, are connected.

Figure 7:
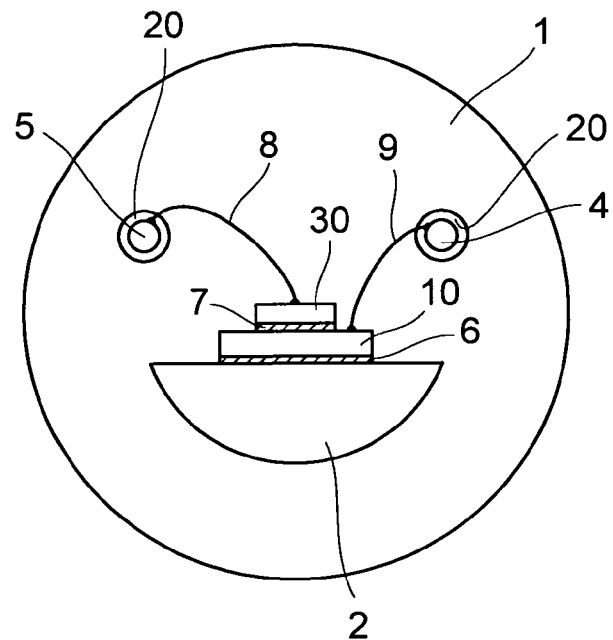
FIG. 7 is a plan view of the semiconductor laser device according to the first embodiment of the invention, showing it with the cap member removed.
Figure 8:
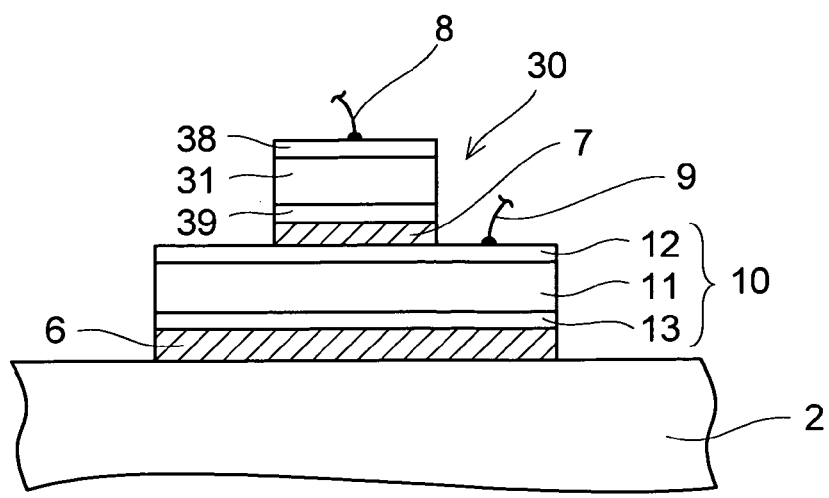
FIG. 8 is an enlarged view of part of the semiconductor laser device according to the first embodiment of the invention.

As shown in FIG. 8, the sub-mount 10 includes an insulating base portion 11 formed of SiC, AlN, Si, diamond, or the like, and metal films 12 and 13 formed on the upper and lower faces, respectively, of the base portion 11. The metal films 12 and 13 are each composed of, for example, a Ti (titanium) layer (unillustrated), a Pt (platinum) layer (unillustrated), and a Au (gold) layer (unillustrated) laid in this order from the base portion 11 side. As shown in FIGS. 1, 3, and 7, the sub-mount 10 is fixed, via a AuSn solder layer 6 (see FIG. 7), in a predetermined region on a tip-end side part of one side face of the block portion 2. The sub-mount 10 has the function of, along with the block portion 2, dissipating the heat generated in the semiconductor laser chip 30.

The semiconductor laser chip 30 is a nitride-based semiconductor laser chip containing nitride semiconductors. As shown in FIG. 8, the semiconductor laser chip 30 has, on the upper- and lower-face sides thereof, a p-side electrode 38 and an n-side electrode 39, respectively; it is arranged with the n-side electrode 39 facing the sub-mount 10, and is fixed, via a AuSn solder layer 7, on the sub-mount 10. Here, it is assumed that a nitride semiconductor at least has a composition $Al_xGa_yIn_zN$ ($0 \leq x \leq 1$, $0 \leq y \leq 1$, $0 \leq z \leq 1$, and $x+y+z=1$). Here, about 20% or less of the nitrogen atoms in the nitride semiconductor may be replaced with any of As, P, and Sb; the nitride semiconductor may be doped with any of Si, O, Cl, C, Ge, Zn, Cd, Mg, and Be. The details of the semiconductor laser chip 30 will be given later.

As shown in FIGS. 1 to 3, the three lead pins 3, 4, and 5 are each formed of a metal material such as copper or iron, and have their surface plated with, for example, gold. Of the three lead pins 3, 4, and 5, the lead pin 3 is fitted directly to a predetermined region on the back (lower) face of the stem 1. On the other hand, of the three lead pins 3, 4, and 5, the lead pins 4 and 5 are put through the through holes 1a and 1b so that their one end portions protrude above the upper face of the stem 1, and are fixed to the stem 1, while insulated therefrom, via insulating rings 20 of glass or the like. As shown in FIGS. 1, 3, 7, and 8, one end portion of the lead pin 5 is electrically connected, via a bonding wire 8, to the p-side electrode 38 (see FIG. 8) of the semiconductor laser chip 30; on the other hand, one end portion of the lead pin 4 is electrically connected, via a bonding wire 9 and the AuSn solder layer 7 (see FIG. 8), to the n-side electrode 39 of the semiconductor laser chip 30.

Figure 4:
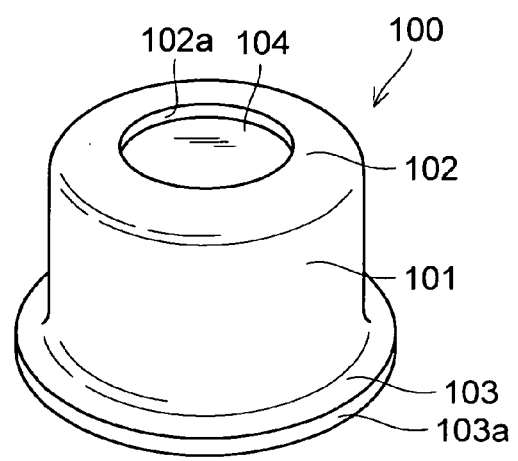
FIG. 4 is an overall perspective view of a cap member in the semiconductor laser device according to the first embodiment of the invention.
Figure 5:
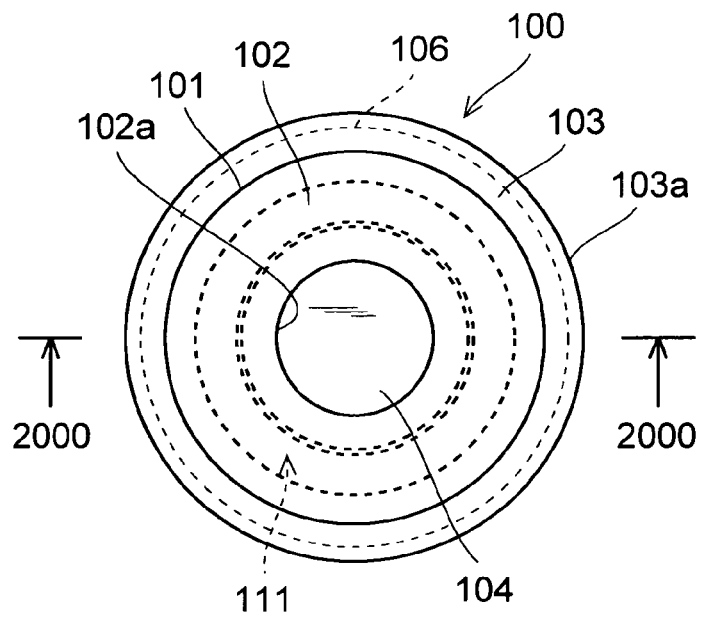
FIG. 5 is a plan view of the cap member in the semiconductor laser device according to the first embodiment of the invention.
Figure 6:
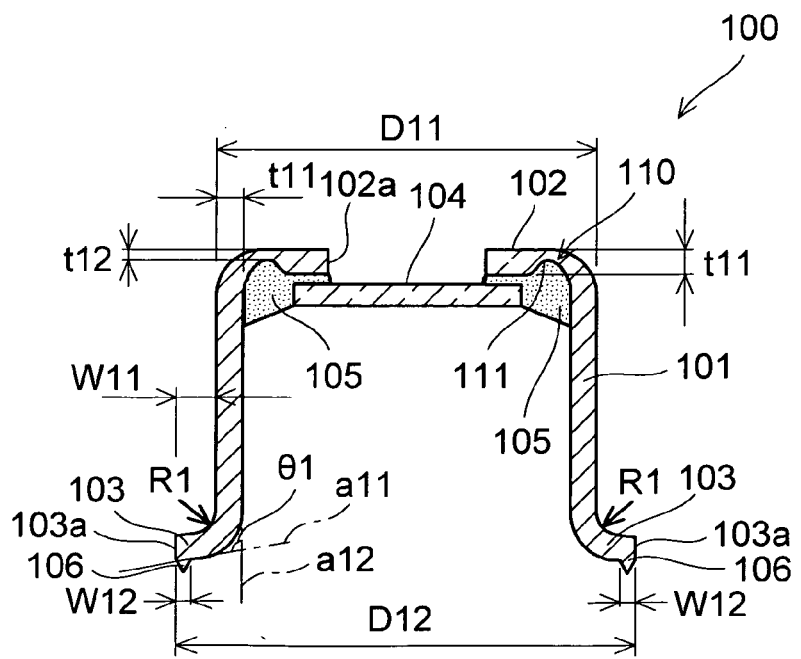
FIG. 6 is a sectional view taken along line 2000-2000 in FIG. 5.

As shown in FIG. 2, the cap member 100 airtightly fitted on the upper face of the stem 1 is formed by press-working of a metal sheet of a metal material such as Kovar, 45 Alloy, iron, or the like, and includes a cylindrical side wall portion 101, a top face portion 102 provided at one end of the side wall portion 101 integrally therewith, and a flange portion 103 provided at the other end of the side wall portion 101 integrally therewith. The surface of the cap member 100 is plated with, for example, nickel. Moreover, as shown in FIGS. 4 to 6, in the top face portion 102 of the cap member 100, a light exit hole 102a is formed through which to extract the laser light emitted from the semiconductor laser chip 30 to outside. As shown in FIG. 5, the light exit hole 102a is formed circular as seen in a plan view, and is arranged substantially in a central part of the top face portion 102. Moreover, to permit the semiconductor laser chip 30 to be airtightly sealed in, the light exit hole 102a is stopped with a light transmission window 104 formed of glass, plastic, or the like that transits laser light. Specifically, as shown in FIG. 6, the light exit hole 102a in the top face portion 102 is stopped with the light transmission window 104 as a result of the light transmission window 104 being airtightly fitted by use of low-melting-point glass 105 from inside the cap member 100. The flange portion 103 is an example of a "fitting portion" according to the invention, and the light transmission window 104 is an example of a "light-transmissive window member" according to the invention. The light exit hole 102a is an example of an "opening" according to the invention.

The flange portion 103 of the cap member 100 is formed at the other end of the side wall portion 101 integrally therewith by being bent outward of the side wall portion 101 with a predetermined radius of curvature R1 relative to the side wall portion 101. Moreover, so that the cap member 100 can cover the block portion 2, the cylindrical side wall portion 101 is given a diameter (exterior diameter) D11 of about 2.28 mm. The flange portion 103 of the cap member 100 is given an exterior diameter D12 of about 2.61 mm. The flange portion 103 is given a radius of curvature R1 of 0.25 mm (at maximum). In the first embodiment, the distance w11 from the outer surface of the side wall portion 101 to one end 103a of the flange portion 103 is about 0.17 mm (=(2.61−2.28)/2), and the radius of curvature R1 is 0.25 mm (at maximum); thus the flange portion 103 has a curved surface. Moreover, in the first embodiment, the flange portion 103 of the cap member 100 is so formed that, when the cap member 100 is viewed on a sectional plane, a line a11 along the bottom face of the flange portion 103 and a line a12 along the side wall portion 101 intersect at an obtuse angle θ1.

The flange portion 103 has, on the bottom face thereof, a projection portion 106 in the shape of a projection projecting in the direction opposite from the top face portion 102 (projecting to the stem 1 side). The projection portion 106 has a width w12 of about 0.1 mm, and is formed, as shown in FIG. 5, to make one turn in the circumferential direction of the flange portion 103. Moreover, the projection portion 106 is formed circular (circumferentially) as seen in a plan view, around one end (end portion) 103a of the flange portion 103. Furthermore, as shown in FIGS. 5 and 6, the projection portion 106 is arranged in an end portion of the flange portion 103 (an end portion thereof opposite from the side wall portion 101) in such a way that the outer circumference of the projection portion 106 coincides with the one end 103a of the flange portion 103. The projection portion 106 is an example of a "projecting portion" according to the invention.

Here, in the first embodiment, as shown in FIGS. 1 and 6, in a predetermined region in the top face portion 102 of the cap member 100, the top face portion 102 has part 110 thereof formed to be less thick than the other part thereof. Specifically, as shown in FIG. 6, in a predetermined region in the inner surface of the top face portion 102 (the inner surface of the cap member 100), a groove portion 111 is formed by, for example, press-working or the like. This groove portion 111 forms the less-thick part 110 in the top face portion 102. The thickness t11 of the cap member 100 (the thickness of the side wall portion 101 and the thickness of the other part of the top face portion 102) is about 0.1 mm, and the thickness t12 of the less-thick part 110 is about 0.07 mm. Moreover, as shown in FIG. 5, the groove portion 111 is formed circular (circumferentially) so as to surround the light exit hole 102a as seen in a plan view, and thus the above-mentioned less-thick part 110 is also formed circular (circumferentially) so as to surround the light exit hole 102a as seen in a plan view. The groove portion 111 is an example of a "first groove portion" according to the invention.

Figure 9:
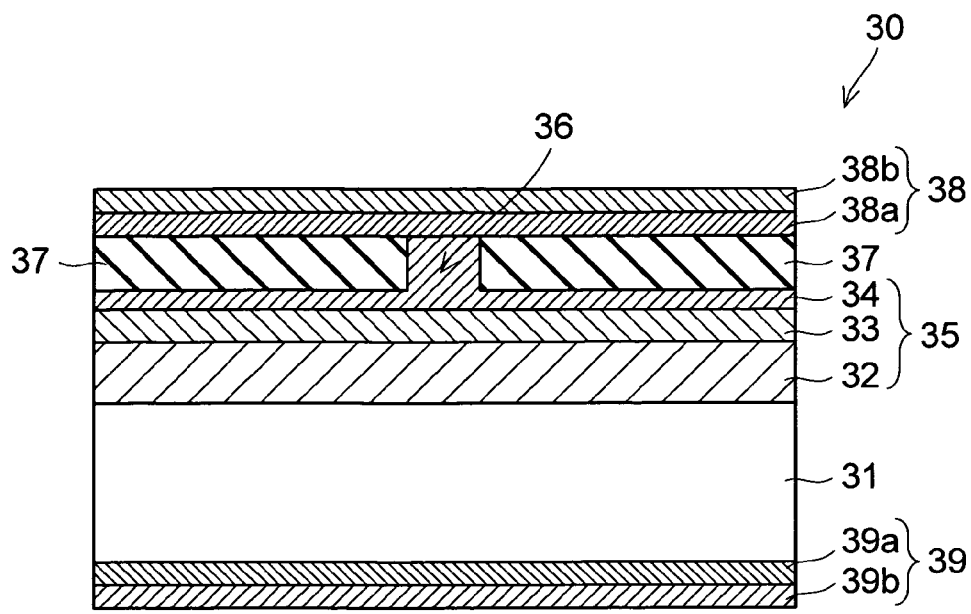
FIG. 9 is a sectional view of a semiconductor laser chip incorporated in the semiconductor laser device according to the first embodiment of the invention.
Figure 10:
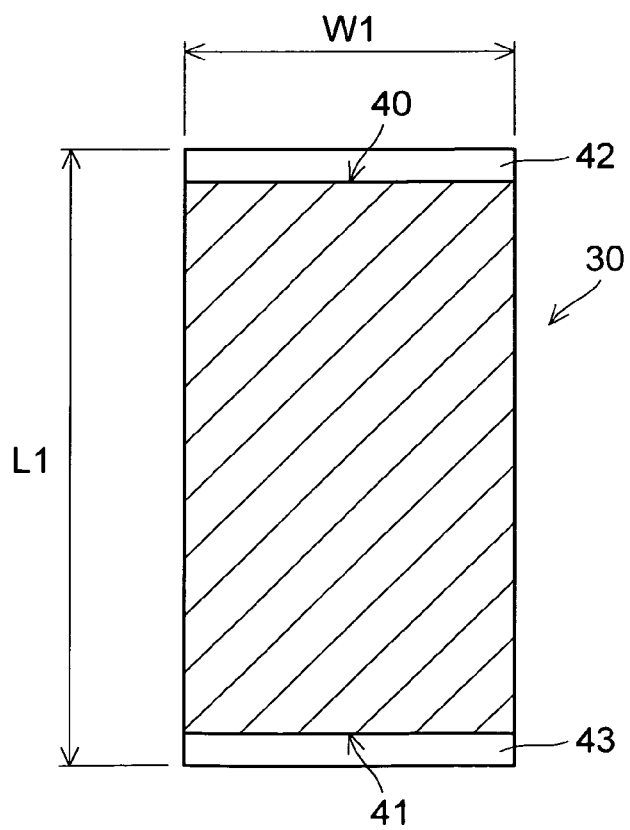
FIG. 10 is a plan view of the semiconductor laser chip incorporated in the semiconductor laser device according to the first embodiment of the invention.

FIGS. 9 and 10 are diagrams illustrating a structure of the semiconductor laser chip incorporated in the semiconductor laser device according to the first embodiment of the invention. Next, with reference to FIGS. 9 and 10, a structure of the semiconductor laser chip incorporated in the semiconductor laser device according to the first embodiment of the invention will be described.

As mentioned previously, the semiconductor laser chip 30 is a nitride-based semiconductor laser chip. Specifically, as shown in FIG. 9, on the upper face of an n-type GaN substrate 31 with a thickness of about 40 µm to about 150 µm, a nitride semiconductor layer 35 is formed that includes, laid in the order named from the n-type GaN substrate 31 side, an n-type clad layer 32, an InGaN active layer 33, and a p-type clad layer 34. The p-type clad layer 34 has an elevated portion and a flat portion elsewhere than in the elevated portion, and the elevated portion forms a stripe-shaped (elongate) ridge portion 36. On the flat portion of the p-type clad layer 34 on both sides of the ridge portion 36, an insulating buried layer 37 formed of silicon oxide is formed.

Moreover, on the upper face of the ridge portion 36 and on the upper face of the buried layer 37, a p-side electrode 38 is formed. The p-side electrode 38 is composed of, for example, a composite layer 38a having Pd (palladium) and Mo (molybdenum) laid in this order from the p-type clad layer 34 side, and a composite layer 38b having Pt (platinum) and Au (gold) laid in this order from the composite layer 38a. On the other hand, on the back (lower) face of the n-type GaN substrate 31, an n-side electrode 39 is formed. The n-side electrode 39 is composed of a composite layer 39a having Hf (hafnium) and Al (aluminum) laid in this order from the n-type GaN substrate 31 side, and a composite layer 39b having Mo (molybdenum), Pt (platinum), and Au (gold) laid in this order from the composite layer 39a side.

Moreover, as shown in FIG. 10, the semiconductor laser chip 30 has a resonator length L1 of about 800 µm and a resonator width W1 of about 400 µm. On a light exit facet 40 of the semiconductor laser chip 30, an AR (anti-reflection) coating layer 42 is formed that is composed of two layers, namely an aluminum nitride layer (unillustrated) and aluminum oxide layer (unillustrated) laid in this order from the light exit facet 40. On the other hand, on a resonator facet 41 opposite from the light exit facet 40, an HR (high-reflection) coating layer 43 is formed that is composed of silicon oxide layers (unillustrated) and titanium oxide layers (unillustrated) laid alternately in a total of 9 layers.

Figure 11:
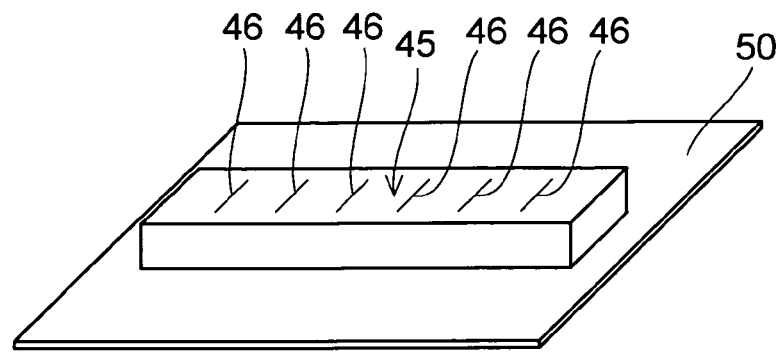
FIG. 11 is a perspective view illustrating a fabrication method of the semiconductor laser chip incorporated in the semiconductor laser device according to the first embodiment of the invention.
Figure 12:
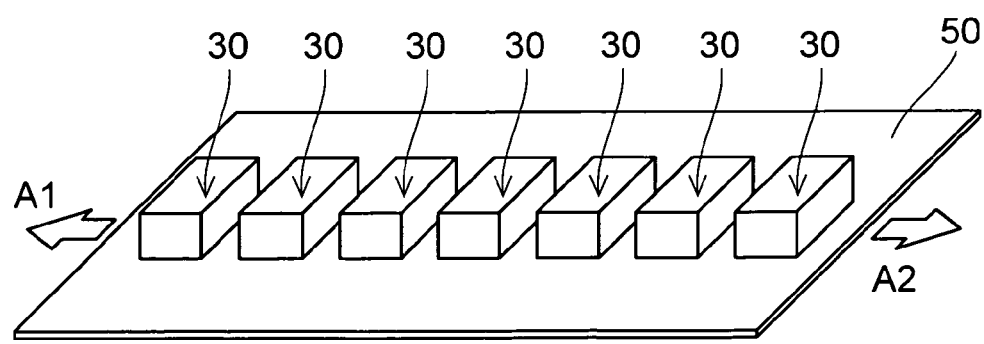
FIG. 12 is a perspective view illustrating the fabrication method of the semiconductor laser chip incorporated in the semiconductor laser device according to the first embodiment of the invention.

FIGS. 11 and 12 are perspective views illustrating a fabrication method of the semiconductor laser chip incorporated in the semiconductor laser device according to the first embodiment of the invention. Next, with reference to FIGS. 9 to 12, a fabrication method of the semiconductor laser chip 30 will be described.

First, on the upper face of the n-type GaN substrate 31 with a thickness of about 350 µm, by epitaxial growth or the like, the n-type clad layer 32, the InGaN active layer 33, the p-type clad layer 34 are formed one after the other. Next, part of the p-type clad layer 34 in a predetermined region is removed by etching to form the ridge portion 36. Thus, as shown in FIG. 9, on the n-type GaN substrate 31, the nitride semiconductor layer 35 composed of the n-type clad layer 32, the InGaN active layer 33, and the p-type clad layer 34 is formed. Subsequently, on both sides of the ridge portion 36, the buried layer 37 formed of silicon oxide is formed. Next, on the ridge portion 36 and on the buried layer 37, the p-side electrode 38 is formed.

Then, the n-type GaN substrate 31 is polished or etched from the back-face side thereof to reduce the thickness of the n-type GaN substrate 31 from its initial thickness of about 350 µm to a thickness of about 40 µm to 150 µm. Thereafter, on the back face of the n-type GaN substrate 31, the n-side electrode 39 is formed. Thus, a wafer (unillustrated) having the nitride semiconductor layer 35, the p-side electrode 38, and the n-side electrode 39 formed therein is obtained. Next, the wafer (unillustrated) is cleaved into bars. Then, by vacuum vapor deposition, sputtering vapor deposition, ECR (electron cyclotron resonance) sputtering, or the like, as shown in FIG. 10, on one cleavage facet that is to become the light exit facet 40, the AR coating layer 42 is formed and, on the other cleavage facet (resonance facet 41), the HR coating layer 43 is formed. The wafer may be etched, instead of cleaved, to form facets. A bar-shaped chip 45 thus formed is shown in FIG. 11.

Subsequently, the bar-shaped chip 45 is affixed on an adhesive sheet 50. Next, by use of an unillustrated scribing machine, with a diamond scriber (unillustrated) provided in the scribing machine, scribe lines 46 are formed on the bar-shaped chip 45. Then, starting at the scribe lines 46, the bar-shaped chip 45 is cleaved into individual pieces. Next, as shown in FIG. 12, the adhesive sheet 50 is expanded in the direction perpendicular to the scribe lines 46 (in the directions of arrows A1 and A2), so that the bar-shaped chip 45 (see FIG. 11) is separated into individual semiconductor laser chips 30. Affixed to the adhesive sheet 50, the semiconductor laser chips 30 even thus separated do not scatter. Separation (splitting) into individual semiconductor laser chips 30 may instead be performed without the use of a diamond scriber, for example by dicing or by laser abrasion. The semiconductor laser chips 30 thus obtained are subjected to characteristics evaluation under pulse current driving, and acceptable chips with threshold current levels smaller than a reference level are screened out for incorporation in can-package-type semiconductor laser devices.

Figure 13:
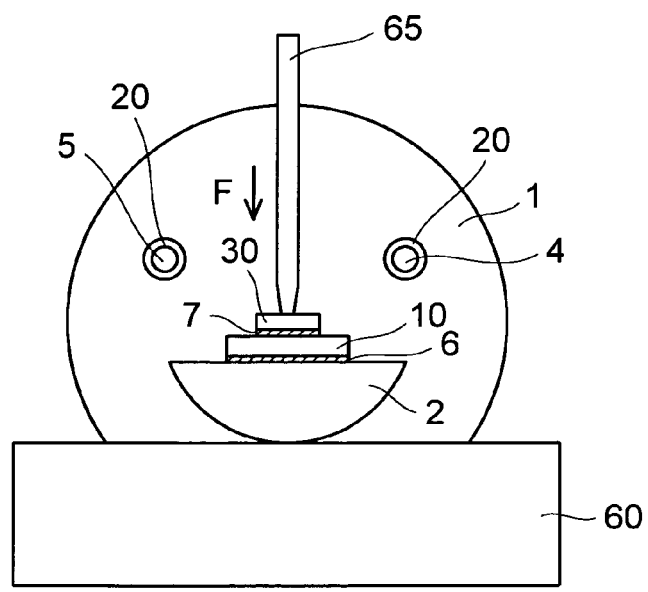
FIG. 13 is a diagram illustrating a mounting method of the semiconductor laser chip in the semiconductor laser device according to the first embodiment of the invention.

FIG. 13 is a diagram illustrating a mounting method of the semiconductor laser chip in the semiconductor laser device according to the first embodiment of the invention. Next, with reference to FIGS. 7 to 9 and 13, a mounting method (die-bonding) of the semiconductor laser chip 30 in the semiconductor laser device according to the first embodiment of the invention will be described.

First, as shown in FIG. 13, the stem 1 is placed on a support stand 60 in a die-bonding machine (unillustrated). Next, the sub-mount 10 having the AuSn solder layers 6 and 7 formed thereon previously is mounted on a side face of the block portion 2. Then the semiconductor laser chip 30 obtained by the above-described fabrication method is, under suction from a collet 65, moved to above the AuSn solder layer 7 of the sub-mount 10. Thereafter, the semiconductor laser chip 30 is mounted on the AuSn solder layer 7 of the sub-mount 10, and suction from the collet 65 is stopped. The AuSn solder layers 6 and 7 each contain Au and Sn in a ratio of 70%:30% (by weight), and have a melting point of about 280° C. Next, with the collet 65, a load F is applied to the semiconductor laser chip 30, which is then heated for five seconds at about 310° C. to melt the AuSn solder layers 6 and 7. Thus Au contained in the n-side electrode 39 (see FIGS. 8 and 9) of the semiconductor laser chip 30 melts into the AuSn solder layer 7, and Au contained in the metal film 13 (see FIG. 8) of the sub-mount 10 melts into the AuSn solder layer 6. As a result, the ratio of Au to Su in the AuSn solder layers 6 and 7 changes from 70%:30% (by weight) in such a way that the content (proportion) of Au increases, resulting in formation of a eutectic. Thereafter, by cooling down to room temperature, the AuSn solder layers 6 and 7 are solidified. In this way, simultaneous die-bonding is performed (whereby the semiconductor laser chip 30, the sub-mount 10, and the block portion 2 of the stem 1 are fixed together.

The AuSn solder layers 6 and 7 may instead be formed of, for example, AuSn solder containing Au and Sn in a ratio of 10%:90% (by weight) and having a melting point of about 217° C. A Sn content of 15 wt % (% by weight) or more offers a practical melting point; accordingly it is preferable that the Sn content be 15 wt % or more but 90 wt % or less. A particularly preferable Sn content is from 15 wt % to 30 wt % or from 80 wt % to 90 wt %, which offers a eutectic point between Au and Sn, or from 30 wt % to 40 wt %, which offers a high melting point.

Subsequently, by use of a wire-bonding machine (unillustrated), as shown in FIGS. 7 and 8, the bonding wire 8 is connected between the p-side electrode 38 (see FIG. 8) of the semiconductor laser chip 30 and the lead pin 5, and the bonding wire 9 is connected between the metal film 12 (see FIG. 8) of the sub-mount 10 and the lead pin 4. In this way, the semiconductor laser chip 30 is mounted on the stem 1 (block portion 2) of the can package.

Figure 14:
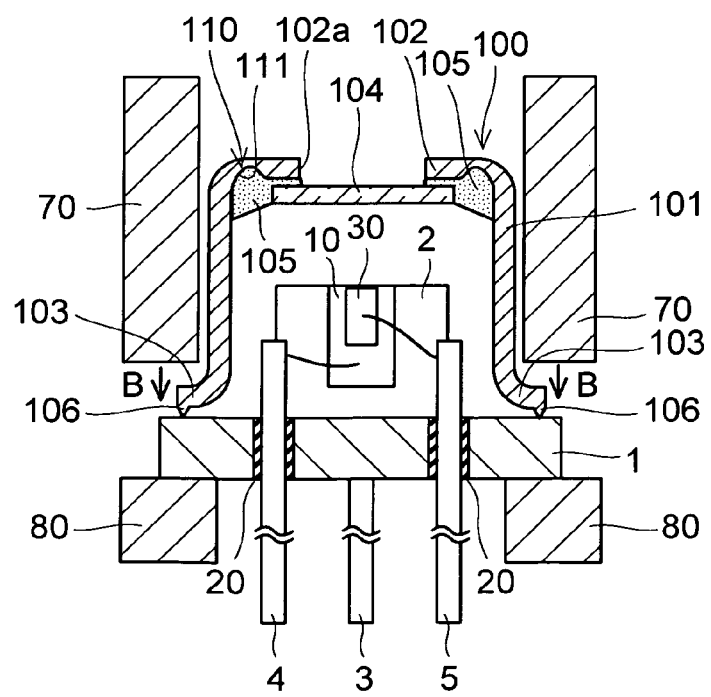
FIG. 14 is a diagram illustrating a method for airtight sealing of the semiconductor laser chip with the cap member.
Figure 15:
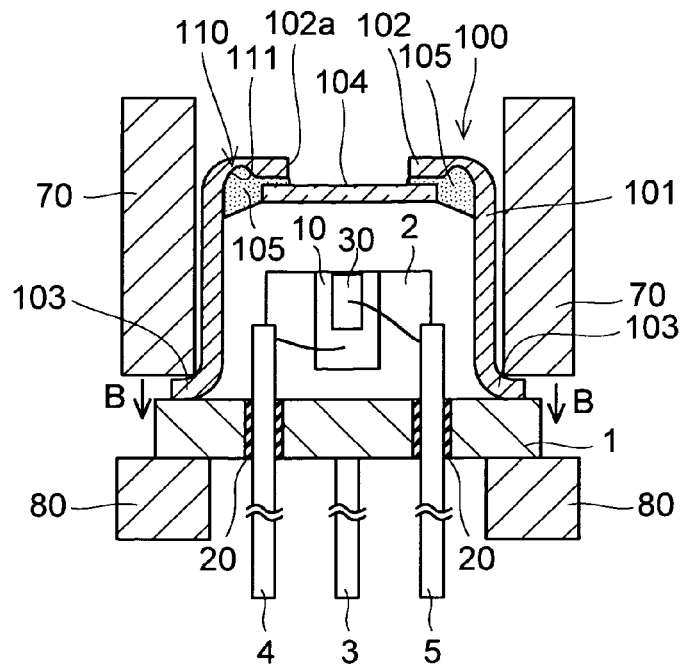
FIG. 15 is a diagram illustrating the method for airtight sealing of the semiconductor laser chip with the cap member.

FIGS. 14 and 15 are diagrams illustrating a method for airtight sealing of the semiconductor laser chip with the cap member. Next, with reference to FIGS. 14 and 15, a method for airtightly sealing the semiconductor laser chip 30 with the cap member 100 will be described.

First, in the manner described above, the stem 1 having the semiconductor laser chip 30 mounted thereon and the cap member 100 are introduced in an oven-equipped airtight sealing machine (unillustrated). Here, dry air at atmospheric pressure is introduced in the airtight sealing machine, and the dew point inside the machine is kept at −40°. Next, the temperature inside the oven is raised to about 260° C., and the just-mentioned stem 1 (the stem 1 having the semiconductor laser chip 30 mounted thereon) and cap member 100 are heated for about 30 minutes. On completion of heating, the stem 1 (the stem 1 having the semiconductor laser chip 30 mounted thereon) and the cap member 100 are taken out of the oven and are, without exposure to the atmosphere, introduced into the airtight sealing machine (unillustrated). Subsequently, as shown in FIG. 14, under an atmosphere with a dew point of −40° C., the cap member 100 is placed on the upper face of the cap member 100 so as to cover the semiconductor laser chip 30.

Next, a second electrode 80 is brought into contact with the lower face of the stem 1, and in addition a first electrode 70 is moved toward the stem 1 (in the direction of arrow B). Then, as shown in FIG. 15, with the first electrode 70, the flange portion 103 of the cap member 100 is pressed in the direction of arrow B so that the projection portion 106 (see FIG. 14) cuts into the upper face of the stem 1. In this state, a voltage is applied between the first and second electrodes 70 and 80 to concentrate electric current at the projection portion 106, so that the heat due to the electrical resistance there causes part of the projection portion 106 to melt. Thus the flange portion 103 of the cap member 100 and the stem 1 are resistance-welded together. Here, the nickel coating plated on the surface of the cap member 100 melts during welding and then solidifies, and thereby effectively achieves airtight sealing of the flange portion 103 and the stem 1. In this way, the cap member 100 is fixed (welded) on the stem 1, and the semiconductor laser chip 30 is sealed airtightly in the cap member 100.

In the first embodiment, as described above, part 110 of the top face portion 102 of the cap member 100 is formed to be less thick than the other part of the top face portion 102 so that, when the cap member 100 is resistance-welded, even if, as a result of the curved-surfaced flange portion 103 being pressed with the first electrode 70, a force is applied to a part of the cap member 100 other than the flange portion 103, the force can be alleviated by the less-thick part 110 provided in the cap member 100. Thus it is possible to alleviate application (transmission) of a force to the low-melting-point glass 105 by use of which the light transmission window 104 is airtightly fitted. That is, since the less-thick part 110 deforms more easily than the other part, when a force is applied to the cap member 100, the less-thick part 110 deforms and thereby makes it less easy for the force to be transmitted to the low-melting-point glass 105. In this way, it is possible to alleviate the inconvenience of the low-melting-point glass 105 breaking and causing the light transmission window 104 to drop off, or the low-melting-point glass 105 developing a crack. Accordingly, by building a semiconductor laser device by use of this cap member 100, it is possible to improve the fabrication yield of the semiconductor laser device. Moreover, since it is possible to alleviate loss of airtightness of the semiconductor laser device, it is possible to alleviate degradation of reliability.

Moreover, in the first embodiment, owing to the cap member 100 being structured as described above, even if, after the cap member 100 is fixed (welded) to the stem 1, some external force is applied to the cap member 100, the less-thick part 110 provided in the cap member 100 can alleviate the external force applied to the cap member 100. Thus it is possible to alleviate application (transmission) of a force to the low-melting-point glass 105, and thus, even in such a case, it is possible to alleviate the inconvenience of the low-melting-point glass 105 by use of which the light transmission window 104 is airtightly fitted breaking, or the low-melting-point glass 105 developing a crack.

Moreover, in the first embodiment, owing to the groove portion 111 being formed in a predetermined region in the top face portion 102, it is possible, with the groove portion 111, to easily form the less-thick part 110 in the top face portion 102.

Moreover, in the first embodiment, owing to the groove portion 111 being formed circumferentially so as to surround the light exit hole 102a as seen in a plan view, it is possible to more easily (effectively) alleviate the inconvenience of the low-melting-point glass 105 breaking and causing the light transmission window 104 to drop off, or the low-melting-point glass 105 developing a crack.

Second Embodiment

Figure 16:
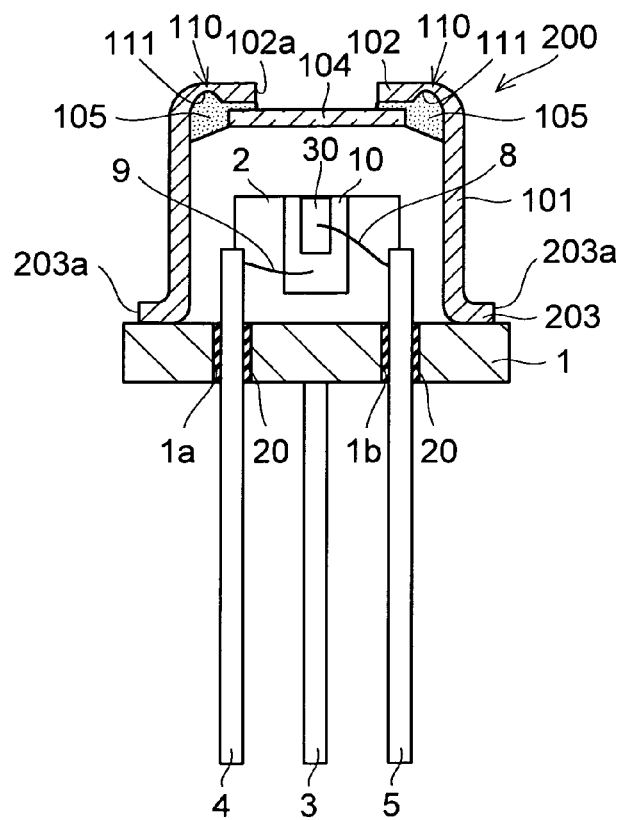
FIG. 16 is a sectional view of a semiconductor laser device according to a second embodiment of the invention.
Figure 17:
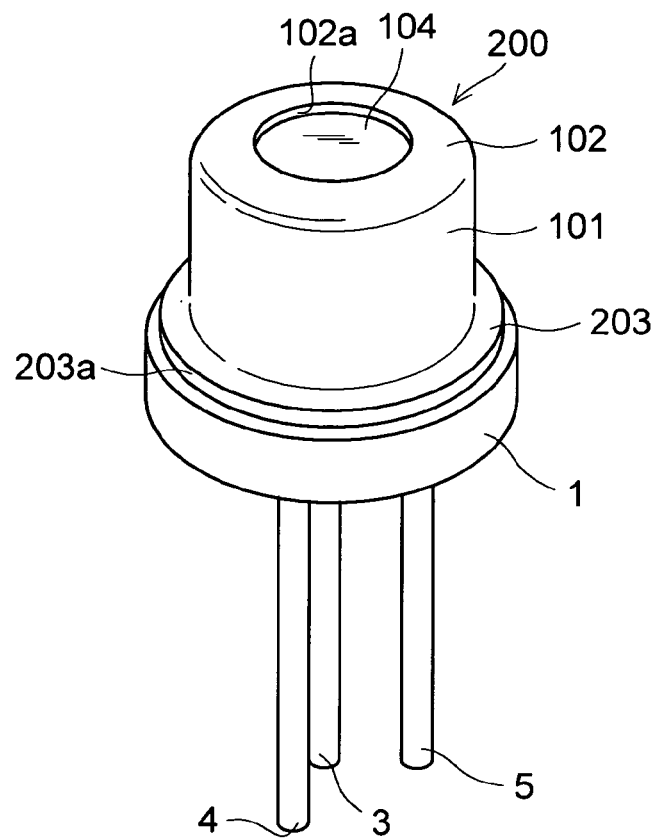
FIG. 17 is an overall perspective view of the semiconductor laser device according to the second embodiment of the invention.
Figure 18:
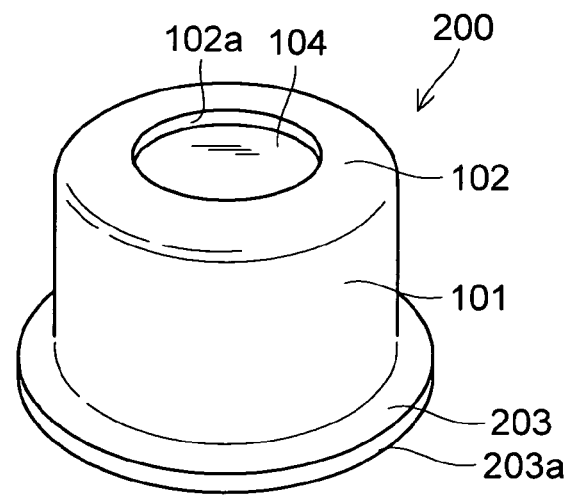
FIG. 18 is an overall perspective view of a cap member in the semiconductor laser device according to the second embodiment of the invention.
Figure 19:
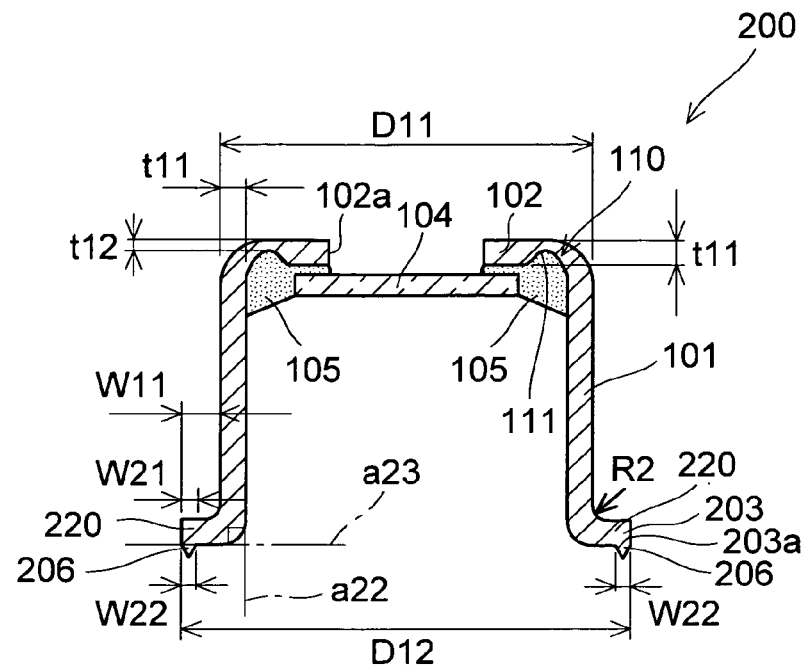
FIG. 19 is a sectional view of the cap member in the semiconductor laser device according to the second embodiment of the invention.

FIG. 16 is a sectional view of a semiconductor laser device according to a second embodiment of the invention. FIG. 17 is an overall perspective view of the semiconductor laser device according to the second embodiment of the invention. FIG. 18 is an overall perspective view of a cap member in the semiconductor laser device according to the second embodiment of the invention. FIG. 19 is a sectional view of the cap member in the semiconductor laser device according to the second embodiment of the invention. Next, with reference to FIGS. 6 and 16 to 19, a structure of the semiconductor laser device according to the second embodiment of the invention will be described. Except for the cap member 200, the structure here is similar to that described in connection with the first embodiment above, and accordingly no overlapping descriptions will be repeated.

In the semiconductor laser device according to the second embodiment, as shown in FIGS. 16 and 17, the cap member 200 is fixed (resistance-welded) on the upper face of the stem 1. As shown in FIGS. 18 and 19, as distinct from the structure of the cap member 100 (see FIG. 6) according to the first embodiment described above, the flange portion 203 of the cap member 200 is given a radius of curvature R2 (see FIG. 19) of 0.07 mm (at maximum). That is, in the second embodiment, the flange portion is given a smaller radius of curvature than in the first embodiment described above. The flange portion 203 is an example of a "fitting portion" according to the invention.

Moreover, as shown in FIG. 19, the cap member 200 in the second embodiment, as in the first embodiment, is given a diameter (exterior diameter) D11 of about 2.28 mm; the flange portion 203 of the cap member 200 is given an exterior diameter D12 of about 2.61 mm. Thus the distance w11 from the outer surface of the side wall portion 101 to one end 203a of the flange portion 203 is about 0.17 mm (=(2.61−2.28)/2). Since the radius of curvature R2 is 0.07 mm (at maximum), the flange portion 203 includes a flat-surfaced portion 220 with a width w21 of about 0.1 mm.

Moreover, in the second embodiment, the flange portion 203 is so formed that, when the cap member 200 is viewed on a sectional plane, a line a23 along the bottom face of the flange portion 203 and a line a22 along the side wall portion 101 intersect substantially perpendicularly.

Moreover, the flange portion 203 has, on the bottom face thereof, a projection portion 206 in the shape of a projection projecting in the direction opposite from the top face portion 102 (projecting to the stem 1 side). The projection portion 206 has a width w22 of about 0.1 mm. In the second embodiment, the projection portion 206 is arranged on the above-mentioned flat-surfaced portion 220 of the flange portion 203. Moreover, as in the first embodiment, the projection portion 206 is so formed as to make one turn in the circumferential direction of the flange portion 203, and is formed circular (circumferentially) as seen in a plan view, around one end (end portion) 203a of the flange portion 203. Furthermore, the projection portion 206 is arranged in an end portion of the flange portion 203 (an end portion thereof opposite from the side wall portion 101) in such a way that the outer circumference of the projection portion 206 coincides with the one end 203a of the flange portion 203.

The cap member 200 in the second embodiment, as in the first embodiment, has part thereof in a predetermined region formed to be less thick than the other part of the top face portion 102. Specifically, as shown in FIG. 19, in a predetermined region in the inner surface of the top face portion 102 (the inner surface of the cap member 200), a groove portion 111 is formed by press-working or the like. This groove portion 111 forms the less-thick part 110 in the top face portion 102. The thickness t11 of the cap member 200 (the thickness of the side wall portion 101 and the thickness of the other part of the top face portion 102) is about 0.1 mm, and the thickness t12 of the less-thick part 110 is about 0.07 mm. Moreover, as in the first embodiment described above, the groove portion 111 is formed circular (circumferentially) so as to surround the light exit hole 102a as seen in a plan view, and thus the above-mentioned less-thick part 110 is also formed circular (circumferentially) so as to surround the light exit hole 102a as seen in a plan view.

In other respects, the structure of the cap member 200 in the second embodiment is similar to that in the first embodiment described above. The cap member 200 in the second embodiment is, by a method similar to that in the first embodiment described above, resistance-welded on the upper face of the stem 1 so as to airtightly seal the semiconductor laser chip 30 in.

Figure 20:
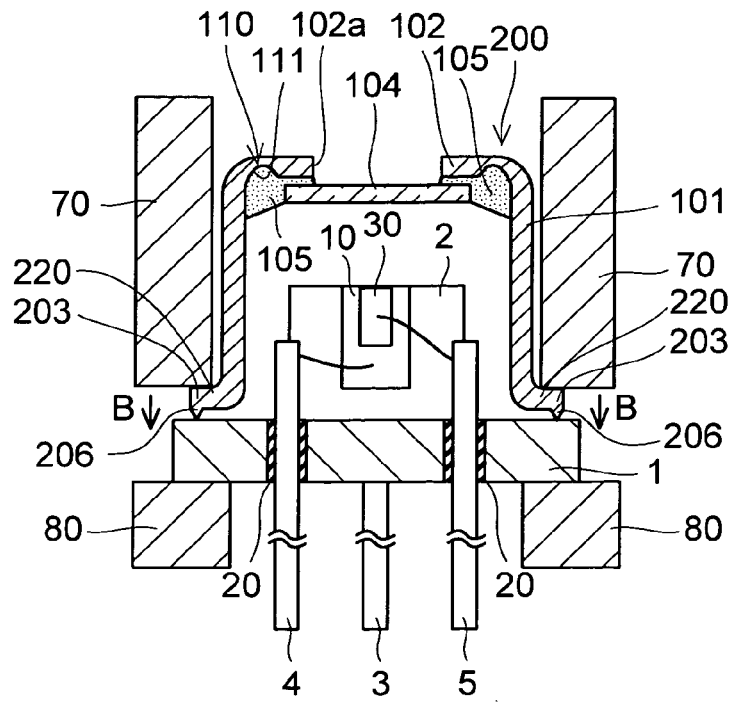
FIG. 20 is a diagram illustrating a method for airtight sealing of the semiconductor laser chip with the cap member.
Figure 21:
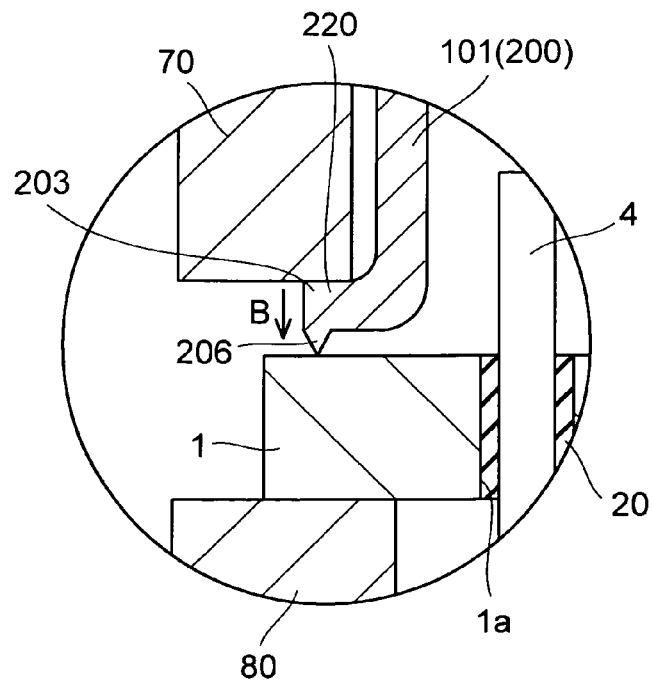
FIG. 21 is a diagram illustrating the method for airtight sealing of the semiconductor laser chip with the cap member.

In the second embodiment, as described above, owing to the flange portion 203 of the cap member 200 being given a radius of curvature R2 of 0.07 mm (at maximum), the flat-surfaced portion 220 is provided in the flange portion 203, and this makes it possible to form the flange portion 203 in such a way that a line a23 along the bottom face of the flange portion 203 and a line a22 along the side wall portion 101 intersect substantially perpendicularly. Thus, as shown in FIGS. 20 and 21, when the flange portion 203 is pressed with the first electrode 70 with a view to fixing (resistance-welding) the cap member 200 on the upper face of the stem 1, it is possible, by pressing the flat-surfaced portion 220 of the flange portion 203, to press the projection portion 206 onto the upper face of the stem 1 in good condition (press it perpendicularly to the upper face of the stem 1). Thus, when the cap member 200 is fixed (resistance-welded) to the upper face of the stem 1, it is possible to alleviate application of a force to a part of the cap member 200 other than the flange portion 203. In this way, it is possible to effectively alleviate the inconvenience of the low-melting-point glass 105 breaking and causing the light transmission window 104 to drop off, or the low-melting-point glass 105 developing a crack.

Moreover, in the second embodiment, as described above, arranging the projection portion 206 in an end portion of the flange portion 203 in such a way that the outer circumference of the projection portion 206 coincides with one end 203a of the flange portion 203 makes it possible to easily form the projection portion 206 on the flat-surfaced portion 220 of the flange portion 203. Thus it is possible to press the projection portion 206 onto the upper face of the stem 1 easily and in good condition. This makes it possible to more effectively alleviate the inconvenience of the low-melting-point glass 105 breaking and causing the light transmission window 104 to drop off, or the low-melting-point glass 105 developing a crack.

The other effects of the second embodiment are similar to those of the first embodiment described above.

Next, tests conducted to confirm the effects of the second embodiment described above will be described. In these tests, a semiconductor laser device in which the cap member 200 according to the second embodiment described above was welded to a stem was taken as Example 1, and a semiconductor laser device in which a cap member provided with no less-thick part was welded to a stem was taken as Comparative Example; with each of these semiconductor laser devices, tests were performed for dropping-off of the light transmission window and for airtightness failure. The semiconductor laser devices of Example 1 and of Comparative Example differed only in the cap member, and were structured similarly otherwise. Resistance-welding of the cap member to the stem 1 was performed by a method similar to that in the first embodiment described above.

Figure 22:
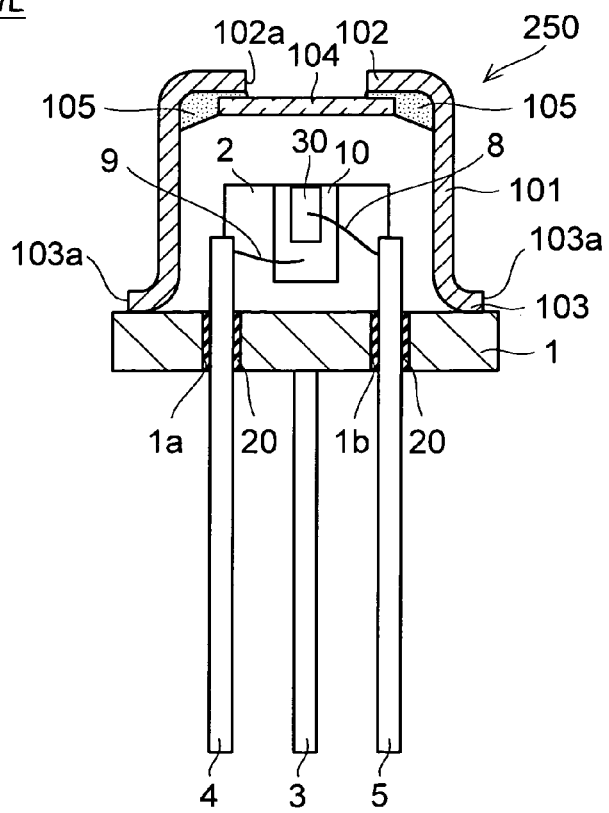
FIG. 22 is a diagram illustrating a structure of a semiconductor laser device as Comparative Example.
Figure 23:
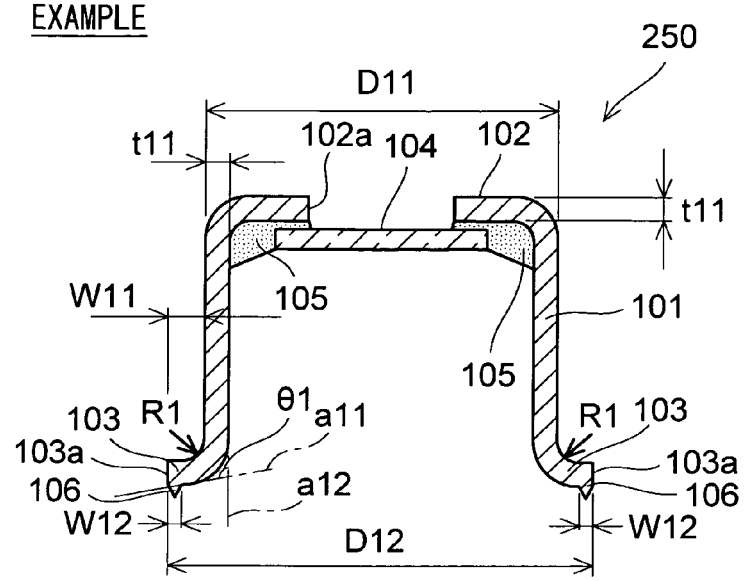
FIG. 23 is a diagram illustrating the structure of the semiconductor laser device as Comparative Example.

FIGS. 22 and 23 are diagrams illustrating a structure of the semiconductor laser device of Comparative Example. As shown in FIGS. 22 and 23, in the semiconductor laser device of Comparative Example, to give it a structure similar to that of conventional semiconductor laser devices, the cap member 250 for airtightly sealing the semiconductor laser chip 30 in was so structured as to have no less-thick part either in the top face portion 102 or in the side wall portion 101. Moreover, in Comparative Example, as shown in FIG. 23, the flange portion 103 of the cap member 250 was given, as in the first embodiment described above, a radius of curvature R1 of 0.25 mm (at maximum). In other respects, the structure here was similar to that of the cap member of the semiconductor laser device of Example 1 (or the first embodiment).

Subjected to the tests were 1,000 samples of the semiconductor laser devices of Example 1 and Comparative Example each. These semiconductor laser devices were first subjected to visual inspection (appearance inspection) under a microscope to inspect for dropping-off of the light transmission window. Then, after those semiconductor laser devices which were found defective were excluded, the rest of the semiconductor laser devices were subjected to inspection for airtightness. The results are shown in Table 1. In Table 1, of each value, the denominator is the number of samples tested, and the numerator is the number of those found defective.

TABLE 1

|  | Comparative Example | Example 1 (Groove Portion Formed in Top Face Portion) |
|---|---|---|
| Dropping-Off of Light Transmission Window | 1/1000 | 0/1000 |
| Airtightness Failure | 1/999 | 0/1000 |

As shown in Table 1 above, with the semiconductor laser device of Comparative Example, out of 1,000 samples tested, one was found to suffer dropping-off of the light transmission window, and one was found to suffer airtightness failure. In contrast, with the semiconductor laser device of Example 1, out of 1,000 samples tested, none was found to suffer dropping-off of the light transmission window, and none was found to suffer airtightness failure.

The results thus confirm that the semiconductor laser device of Example 1 can alleviate degradation of reliability and can improve fabrication yields. Incidentally, from the perspective of quality control, even one defective sample out of a predetermined number tested may necessitate total inspection and, if a need for total inspection arises once mass fabrication has started, significantly lower fabrication efficiency results. Thus the semiconductor laser device of Example 1 is considered to offer better effects than that of Comparative Example.

Figure 24:
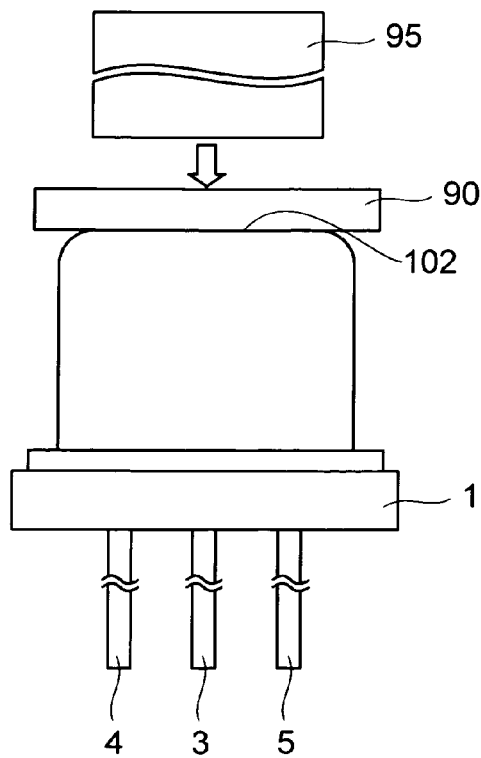
FIG. 24 is a diagram illustrating a method for measuring withstand load by applying a load to the top face portion of the cap member.
Figure 25:
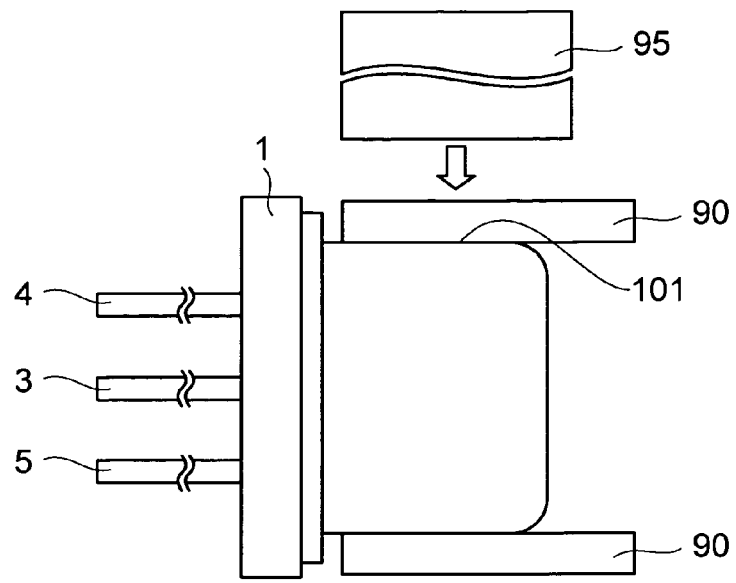
FIG. 25 is a diagram illustrating a method for measuring withstand load by applying a load to the side wall portion of the cap member.

Next, to check how easily the low-melting-point glass broke when an external force was applied to the cap member, with the semiconductor laser devices of Example 1 and Comparative Example, withstand load against an external force applied to the cap member was evaluated. Withstand load was measured in two patterns: one in which a load was applied to the top face portion, and the other in which a load was applied to the side wall portion. FIG. 24 is a diagram illustrating the method for measuring withstand load by applying a load to the top face portion of the cap member. As shown in FIG. 24, to apply a load to the top face portion, a metal plate 90 was placed on the top face portion 102 of the cap member of the semiconductor laser device, and a predetermined load was applied to the metal plate 90 by use of a load application machine 95. After a predetermined load was applied by the method described above, the load was removed, and in this way a plurality of semiconductor laser devices to which different loads had been applied were fabricated. The load applied to the cap member was varied in steps of 0.25 kgf. Then the semiconductor laser devices thus having loads applied thereto were each subjected to appearance inspection and airtightness inspection to check whether or not the low-melting-point glass had developed a crack. The load applied to a semiconductor laser device in which the low-melting-point glass had developed a crack was taken as the withstand load of its cap member. FIG. 25 is a diagram illustrating the method for measuring withstand load by applying a load to the side wall portion of the cap member. As shown in FIG. 25, to apply a load to the side wall portion, a metal plate 90 was placed on the side wall portion 101 of the cap member of the semiconductor laser device, and a predetermined load was applied to the metal plate 90 by use of a load application machine 95. The load applied was varied, and the withstand load was evaluated, in similar manners as when the load was applied to the top face portion. The results (each value being the average of ten withstand load measurements) are shown in Table 2.

TABLE 2

|  | Comparative Example | Example 1 (Groove Portion Formed in Top Face Portion) |
|---|---|---|
| Withstand Load on Top Face Portion | 2.2 | 3.75 |
| Withstand Load on Side Wall Portion | 7.2 | 7.4 |

(Unit: kgf)

As Table 2 above shows, the withstand load when a load was applied to the top face portion was 2.2 kgf in Comparative Example in contrast to 3.75 kgf in Example 1, a value higher than in Comparative Example. On the other hand, the withstand load when a load was applied to the side wall portion was 7.2 kgf in Comparative Example in contrast to 7.4 kgf in Example 1, a value slightly higher than in Comparative Example. This confirms that forming a groove portion in the top face portion makes the low-melting-point glass less likely to break when an external force is applied to the top face portion.

Third Embodiment

Figure 26:
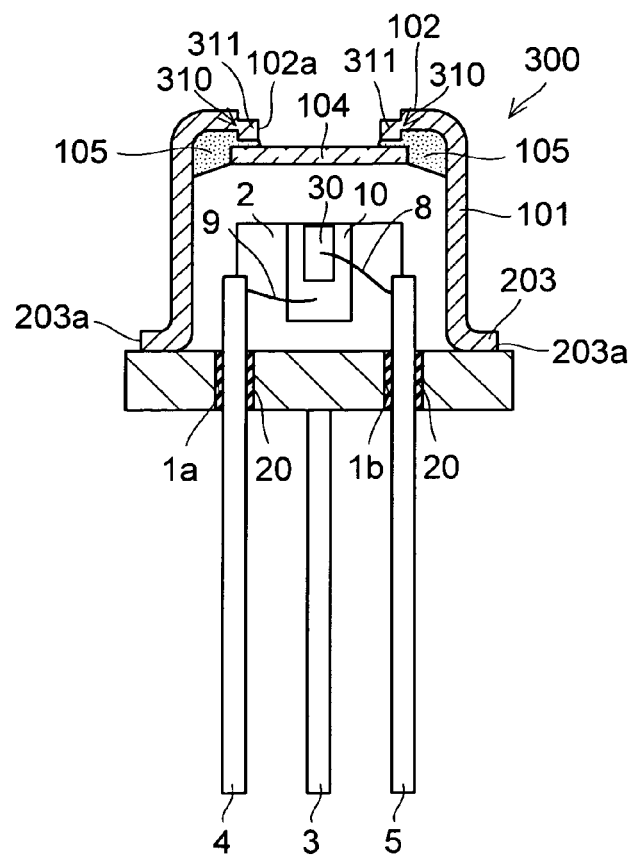
FIG. 26 is a sectional view of a semiconductor laser device according to a third embodiment of the invention.
Figure 27:
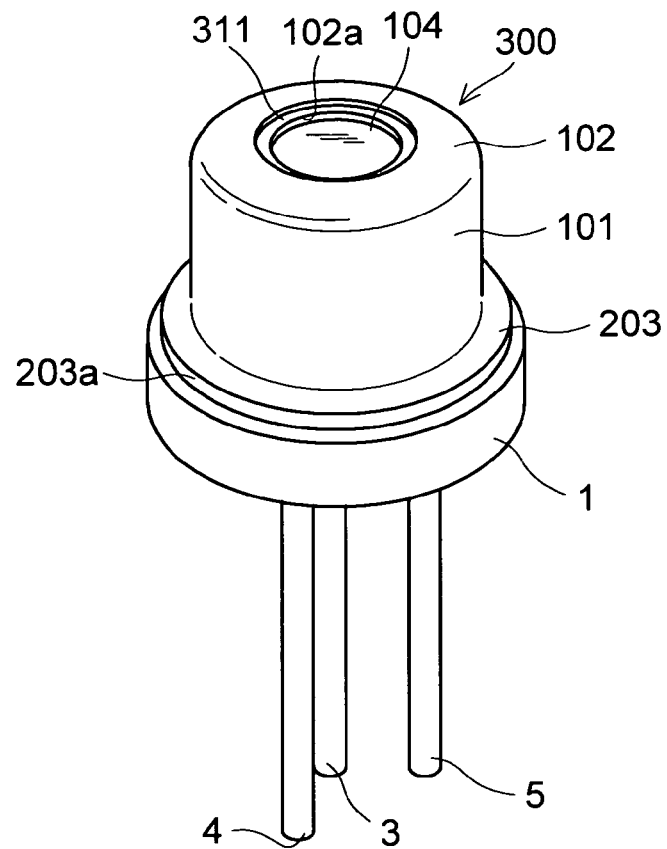
FIG. 27 is an overall perspective view of the semiconductor laser device according to the third embodiment of the invention.
Figure 28:
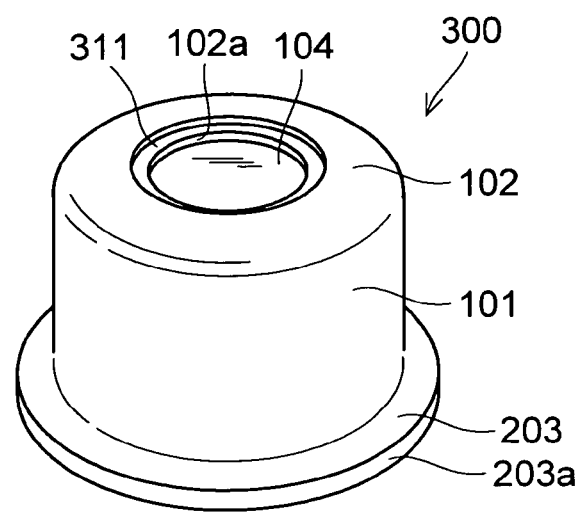
FIG. 28 is an overall perspective view of a cap member in the semiconductor laser device according to the third embodiment of the invention.
Figure 29:
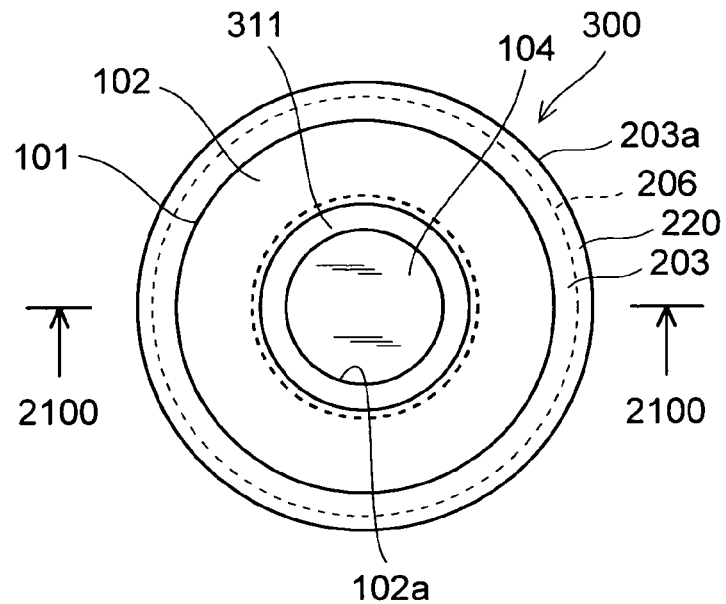
FIG. 29 is a plan view of the cap member in the semiconductor laser device according to the third embodiment of the invention.
Figure 30:
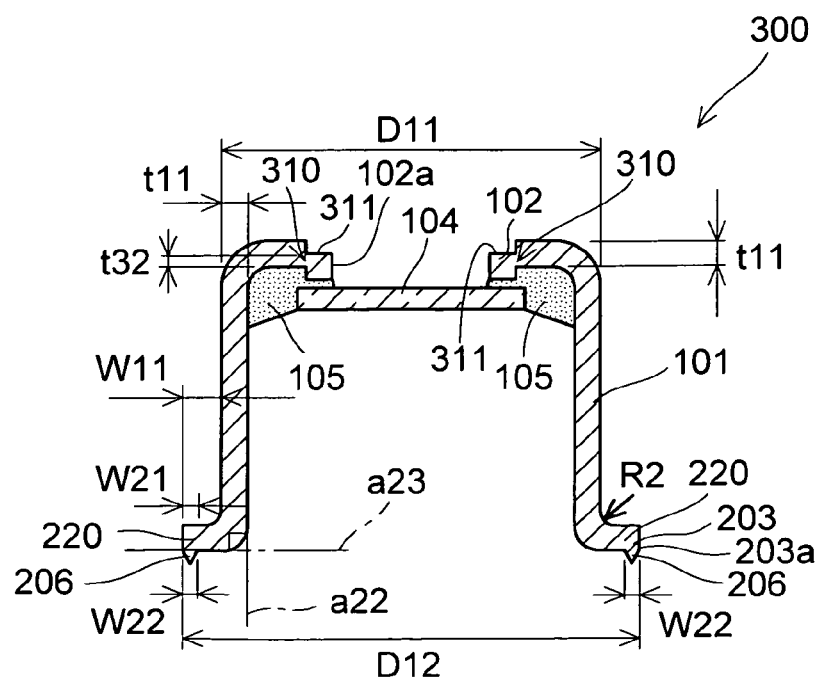
FIG. 30 is a sectional view taken along line 2100-2100 in FIG. 29.

FIG. 26 is a sectional view of a semiconductor laser device according to a third embodiment of the invention. FIG. 27 is an overall perspective view of the semiconductor laser device according to the third embodiment of the invention. FIG. 28 is an overall perspective view of a cap member in the semiconductor laser device according to the third embodiment of the invention. FIGS. 29 and 30 are diagrams illustrating a structure of the cap member in the semiconductor laser device according to the third embodiment of the invention. Next, with reference to FIGS. 26 to 30, a structure of the semiconductor laser device according to the third embodiment of the invention. Except for the cap member 300, the structure here is similar to those described in connection with the first and second embodiments above, and accordingly no overlapping descriptions will be repeated.

In the semiconductor laser device according to the third embodiment, as shown in FIGS. 26 to 28, in a rim portion of the light exit hole 102a, by press-working or the like, a step portion 311 is formed. The step portion 311 is an example of a "first step portion" according to the invention. As shown in FIG. 29, the step portion 311 is formed all around the rim portion of the light exit hole 102a. That is, the step portion 311 is formed circumferentially (circular) as seen in a plan view, around the rim portion of the light exit hole 102a of the top face portion 102. As shown in FIG. 30, this step portion 311 makes part 310 (with a thickness t32) of the top face portion 102 less thick than the other part of the top face portion 102. This less-thick part 310 is formed circumferentially (circular) as seen in a plan view, around the rim portion of the light exit hole 102a of the top face portion 102.

In other respects, the structure of the cap member 300 in the third embodiment is similar to that in the second embodiment described above. The cap member 300 in the third embodiment is, by a method similar to that in the second embodiment, resistance-welded on the upper face of the stem 1 so as to airtightly seal the semiconductor laser chip 30 in.

In the third embodiment, as described above, owing to the step portion 311 being formed in a rim portion of the light exit hole 102a, the step portion 311 permits part 310 of the top face portion 102 to be easily formed to be less thick than the other part thereof. Thus it is possible to easily obtain a semiconductor laser device that, even if a force is applied to the cap member 300, can alleviate the inconvenience of the low-melting-point glass 105 breaking and causing the light transmission window 104 to drop off, or the low-melting-point glass 105 developing a crack.

The other effects of the third embodiment are similar to those of the first and second embodiments described above.

Next, tests conducted to confirm the effects of the third embodiment described above will be described. These tests were performed by use of methods similar to those used with the second embodiment described above. The semiconductor laser device according to the third embodiment described above was taken as Example 2, and, as the results with Comparative Example, those obtained in the tests conducted in comparison with the second embodiment described above were used. The results are shown in Table 3.

TABLE 3

|  | Comparative Example | Example 2 (Step Portion Formed in Top Face Portion) |
|---|---|---|
| Dropping-Off of Light Transmission Window | 1/1000 | 0/1000 |
| Airtightness Failure | 1/999 | 0/1000 |

As shown in Table 3 above, with the semiconductor laser device of Example 2, out of 1,000 samples tested, none was found to suffer dropping-off of the light transmission window, and none was found to suffer airtightness failure. This confirms that the semiconductor laser device of Example 2 (the third embodiment), like that of Example 1 (the second embodiment) described above, is superior to that of Comparative Example.

Next, to check how easily the low-melting-point glass broke when an external force was applied to the cap member, withstand load was measured. Withstand load was measured by use of methods similar to those used with the second embodiment described above. Moreover, withstand load was measured in two patterns: one in which a load was applied to the top face portion, and the other in which a load was applied to the side wall portion. As the results with Comparative Example, those obtained in the measurement conducted in comparison with the second embodiment described above were used. The results (each value being the average of ten withstand load measurements) are shown in Table 4.

TABLE 4

|  | Comparative Example | Example 2 (Step Portion Formed in Top Face Portion) |
|---|---|---|
| Withstand Load on Top Face Portion | 2.2 | 4.2 |
| Withstand Load on Side Wall Portion | 7.2 | 8.2 |

(Unit: kgf)

As Table 4 above shows, the withstand load when a load was applied to the top face portion was 2.2 kgf in Comparative Example in contrast to 4.2 kgf in Example 2, a value nearly twice as high as that in Comparative Example. On the other hand, the withstand load when a load was applied to the side wall portion was 7.2 kgf in Comparative Example in contrast to 8.2 kgf in Example 2, again a value higher than in Comparative Example. This confirms that forming a step portion in the top face portion makes the low-melting-point glass less likely to break both when an external force is applied to the top face portion and when an external force is applied to the side wall portion.

Fourth Embodiment

Figure 31:
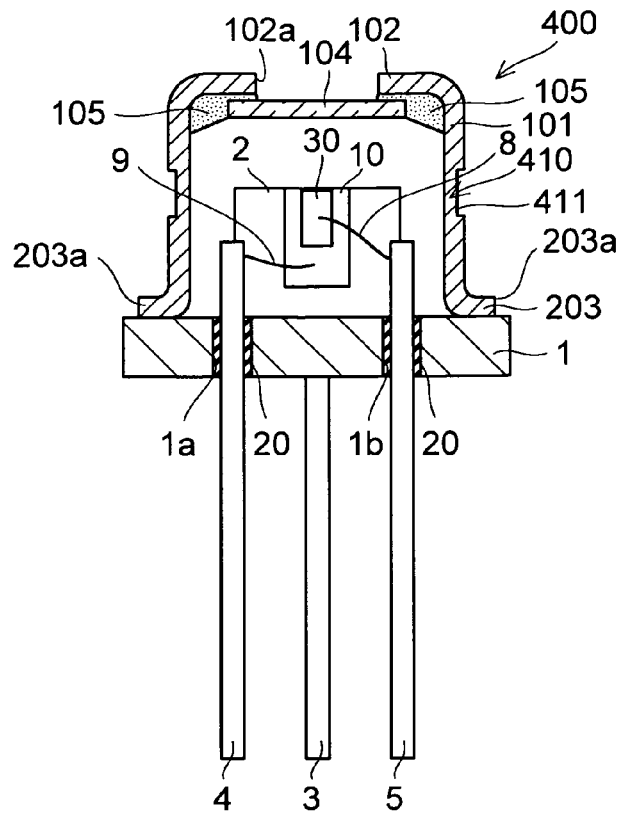
FIG. 31 is a sectional view of a semiconductor laser device according to a fourth embodiment of the invention.
Figure 32:
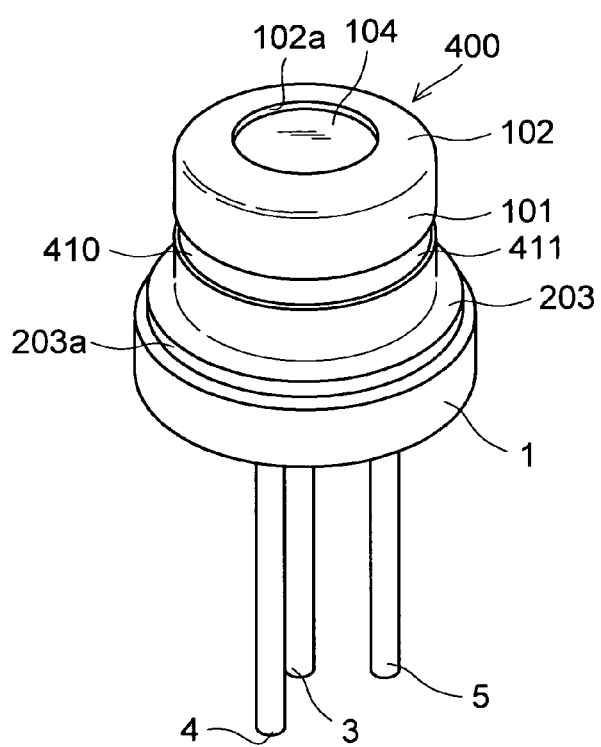
FIG. 32 is an overall perspective view of the semiconductor laser device according to the fourth embodiment of the invention.
Figure 33:
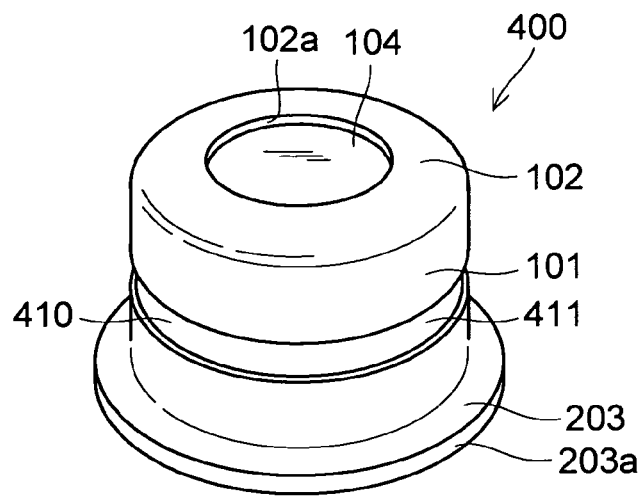
FIG. 33 is an overall perspective view of a cap member in the semiconductor laser device according to the fourth embodiment of the invention.
Figure 34:
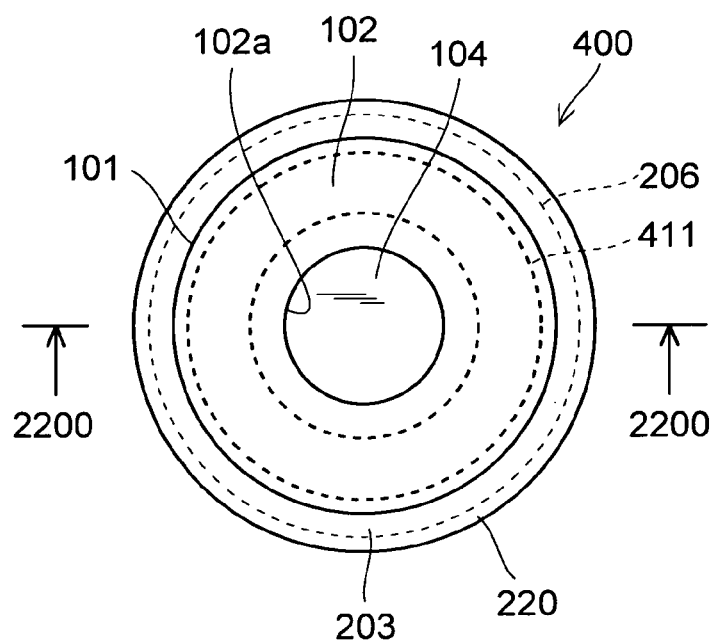
FIG. 34 is a plan view of the cap member in the semiconductor laser device according to the fourth embodiment of the invention.
Figure 35:
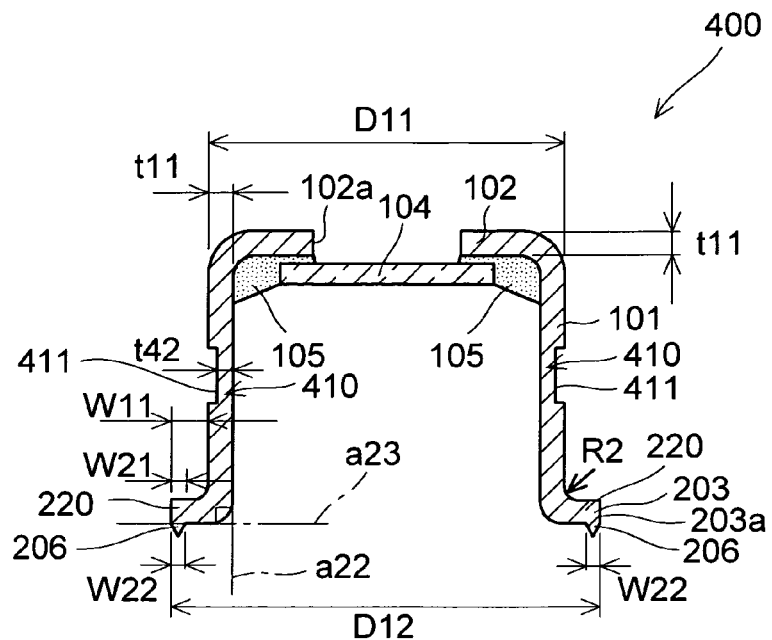
FIG. 35 is a sectional view taken along line 2200-2200 in FIG. 34.

FIG. 31 is a sectional view of a semiconductor laser device according to a fourth embodiment of the invention. FIG. 32 is an overall perspective view of the semiconductor laser device according to the fourth embodiment of the invention. FIG. 33 is an overall perspective view of a cap member in the semiconductor laser device according to the fourth embodiment of the invention. FIGS. 34 and 35 are diagrams illustrating a structure of the cap member in the semiconductor laser device according to the fourth embodiment of the invention. Next, with reference to FIGS. 31 to 35, a structure of the semiconductor laser device according to the fourth embodiment of the invention will be described. Except for the cap member 400, the structure here is similar to those described in connection with the first to third embodiments above, and accordingly no overlapping descriptions will be repeated.

In the semiconductor laser device according to the fourth embodiment, as shown in FIGS. 31 to 33, in a predetermined region in the side wall portion 101 of the cap member 400, a groove portion 411 is formed. As shown in FIGS. 33 and 34, the groove portion 411 is formed in the outer surface of the side wall portion 101, and is formed so as to make one turn in the circumferential direction of the side wall portion 101. Owing to this groove portion 411, part 410 of the side wall portion 101 is formed to be less thick than the other part of the side wall portion 101 and so as to make one turn in the circumferential direction of the side wall portion 101. The groove portion 411 is an example of a "second groove portion" according to the invention.

Moreover, as shown in FIG. 35, the less-thick part 410 that the groove portion 411 forms in the side wall portion 101 is given a thickness t42 of about 0.07 mm. The groove portion 411 can be formed by cutting or press-working. In a case where the groove portion 411 is formed by press-working, in a sheet material before forming the cap member 400, in a region therein corresponding to the side wall portion 101, a groove portion is formed previously by press-working, and then the sheet material having the groove portion formed therein is formed into the cap member 400 by press working; in this way, the groove portion 411 can be formed in the side wall portion 101 of the cap member 400. In the fourth embodiment, as distinct from the second and third embodiment described above, the less-thick part 410 is formed only in the side wall portion 101.

In other respects, the structure of the cap member 400 in the fourth embodiment is similar to those in the second and third embodiments described above. The cap member 400 in the fourth embodiment is, by a method similar to those in the first to third embodiments described above, resistance-welded on the upper face of the stem 1 so as to airtightly seal the semiconductor laser chip 30 in.

In the fourth embodiment, as described above, owing to the groove portion 411 being formed in a predetermined region in the side wall portion 101, the groove portion 411 permits part 410 of the side wall portion 101 of the cap member 400 to be easily formed to be less thick than other part thereof. Thus it is possible to easily obtain a semiconductor laser device that, even if a force is applied to the cap member 400, can alleviate the inconvenience of the low-melting-point glass 105 breaking and causing the light transmission window 104 to drop off, or the low-melting-point glass 105 developing a crack.

The other effects of the fourth embodiment are similar to those of the first to third embodiments described above.

Next, tests conducted to confirm the effects of the fourth embodiment described above will be described. These tests were performed by use of methods similar to those used with the second and third embodiments described above. The semiconductor laser device according to the fourth embodiment described above was taken as Example 3, and, as the results with Comparative Example, those obtained in the tests conducted in comparison with the second embodiment described above were used. The results are shown in Table 5.

TABLE 5

|  | Comparative Example | Example 3 (Groove Portion Formed in Side Wall Portion) |
|---|---|---|
| Dropping-Off of Light Transmission Window | 1/1000 | 0/1000 |
| Airtightness Failure | 1/999 | 0/1000 |

As shown in Table 5 above, with the semiconductor laser device of Example 3, out of 1,000 samples tested, none was found to suffer dropping-off of the light transmission window, and none was found to suffer airtightness failure. This confirms that the semiconductor laser device of Example 3 (the fourth embodiment), like those of Examples 1 and 2 (the second and fourth embodiments) described above, is superior to that of Comparative Example.

Next, to check how easily the low-melting-point glass broke when an external force was applied to the cap member, withstand load was measured. Withstand load was measured by use of methods similar to those used with the second and third embodiments described above. Moreover, withstand load was measured in two patterns: one in which a load was applied to the top face portion, and the other in which a load was applied to the side wall portion. As the results with Comparative Example, those obtained in the measurement conducted in comparison with the second embodiment described above were used. The results (each value being the average of ten withstand load measurements) are shown in Table 6.

TABLE 6

|  | Comparative Example | Example 3 (Groove Portion Formed in Side Wall Portion) |
|---|---|---|
| Withstand Load on Top Face Portion | 2.2 | 2.3 |
| Withstand Load on Side Wall Portion | 7.2 | 9.3 |

(Unit: kgf)

As Table 6 above shows, no significant difference in the withstand load when a load was applied to the top face portion was recognized between Comparative Example and Example 3. On the other hand, the withstand load when a load was applied to the side wall portion was 7.2 kgf in Comparative Example in contrast to 9.3 kgf in Example 3, a value higher than in Comparative Example. This confirms that forming a groove portion in the side wall portion makes the low-melting-point glass less likely to break when an external force is applied to the side wall portion.

Fifth Embodiment

Figure 36:
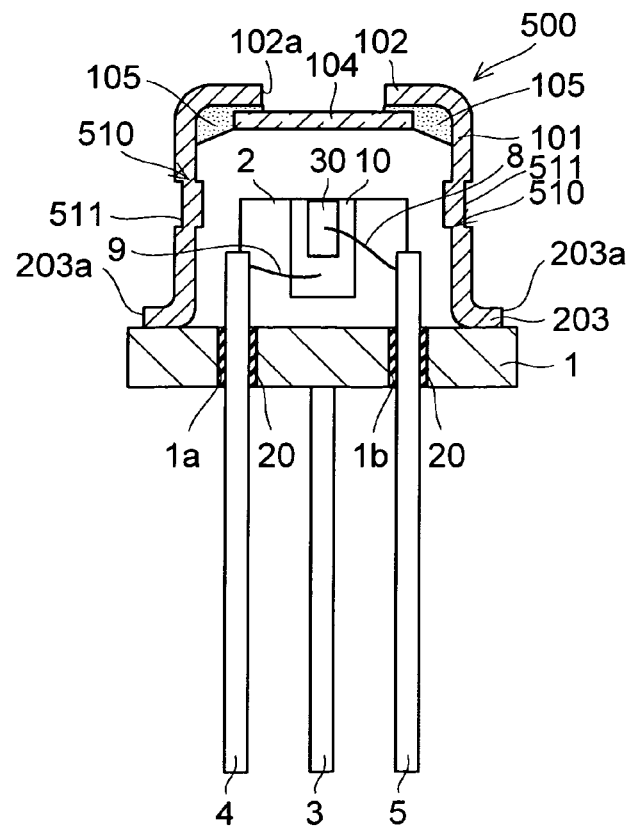
FIG. 36 is a sectional view of a semiconductor laser device according to a fifth embodiment of the invention.
Figure 37:
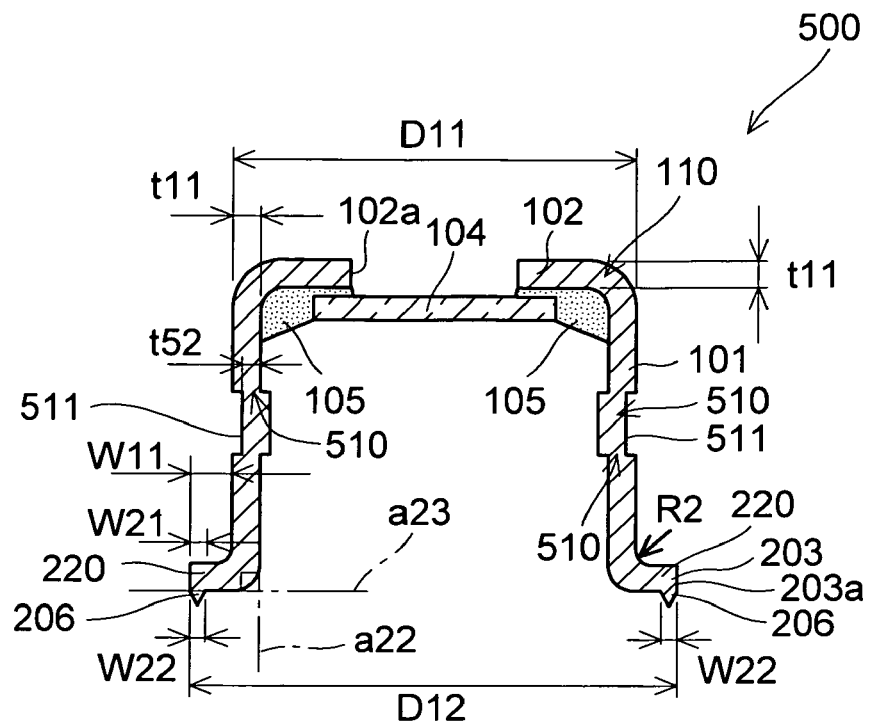
FIG. 37 is a sectional view of a cap member in the semiconductor laser device according to the fifth embodiment of the invention.

FIG. 36 is a sectional view of a semiconductor laser device according to a fifth embodiment of the invention. FIG. 37 is a sectional view of a cap member in the semiconductor laser device according to the fifth embodiment of the invention. Next, with reference to FIGS. 36 and 37, a structure of the semiconductor laser device according to the fifth embodiment of the invention will be described. Except for the cap member 500, the structure here is similar to those described in connection with the first to fourth embodiments above, and accordingly no overlapping descriptions will be repeated.

In the semiconductor laser device according to the fifth embodiment, as shown in FIGS. 36 and 37, in a predetermined region in the side wall portion 101 of the cap member 500, a step portion 511 is formed. The step portion 511 is formed so as to make one turn in the circumferential direction of the side wall portion 101. Owing to this step portion 511, part 510 (with a thickness t52) of the side wall portion 101 is formed less thick than the other part of the side wall portion 101 and so as to make one turn in the circumferential direction of the side wall portion 101. As in the fourth embodiment described above, the step portion 511 can be formed by cutting or press-working. The step portion 511 is an example of a "second step portion" according to the invention.

In other respects, the structure of the cap member 500 in the fifth embodiment is similar to that in the fourth embodiment described above. The cap member 500 in the fifth embodiment is, by a method similar to those in the first to fourth embodiments described above, resistance-welded on the upper face of the stem 1 so as to airtightly seal the semiconductor laser chip 30 in.

In the fifth embodiment, as described above, owing to the step portion 511 being formed in a predetermined region in the side wall portion 101, the step portion 511 permits part 510 of the side wall portion 101 of the cap member 500 to be easily formed to be less thick than the other part thereof. Thus it is possible to easily obtain a semiconductor laser device that, even if a force is applied to the cap member 500, can alleviate the inconvenience of the low-melting-point glass 105 breaking and causing the light transmission window 104 to drop off, or the low-melting-point glass 105 developing a crack.

The other effects of the fifth embodiment are similar to those of the first to fourth embodiments described above.

It should be understood that all the embodiments presented herein are, in every respect, of the exemplary, and hence not limiting, nature. The scope of the present invention is to be determined not by the description of the embodiments given above but by the appended claims, and encompasses any variations and modifications in the sense and within the scope equivalent to the scope of the claims.

For example, although the first to fifth embodiments described above deal with examples in which the invention is applied to a nitride-based semiconductor laser device incorporating a nitride-based semiconductor laser chip, this is not meant to limit the invention; the invention may be applied also to semiconductor devices incorporating semiconductor chips other than nitride-based semiconductor laser chips. For example, the invention may be applied to semiconductor devices incorporating laser chips employing organic semiconductors or zinc-oxide-based semiconductors, and those incorporating other laser chips currently under development and expected to offer excellent characteristics surpassing nitride-based semiconductor laser chips in the future. Moreover, instead of a nitride-based semiconductor laser chip, a semiconductor chip such as an SLD (superluminescence diode) or LED (light-emitting diode) may be incorporated. In a semiconductor laser device incorporating a nitride-based semiconductor laser chip, the nitride-based semiconductor laser chip incorporated may have any structure other than that in the first to fifth embodiments described above.

Although the first to fifth embodiments described above deal with examples in which the invention is applied to a can-package-type semiconductor laser device with a package size of 3.3 mm in diameter, this is not meant to limit the invention; the invention may be applied also to semiconductor devices with packages sizes other than 3.3 mm in diameter. For example, the invention may be applied to semiconductor devices with a package size of 3.8 mm in diameter, or to semiconductor devices with package sizes smaller than 3.3 mm in diameter. The invention may also be applied to semiconductor devices with package sizes larger than 3.8 mm in diameter.

Although the first to fifth embodiments described above deal with examples in which the cap member is formed substantially cylindrical, this is not meant to limit the invention; the cap member may be in the shape of a rectangular parallelepiped, or may be in a shape obtained by cutting a part or parts of an arc on the top face of a cylinder on a plane perpendicular to the top face, that is a D- or I-shape as seen from the top face side. This makes it possible to achieve further space saving compared with a cylinder of the same diameter.

Although the third to fifth embodiments described above deal with examples in which the radius of curvature of the flange portion of the cap member is made smaller than in the first embodiment described above, this is not meant to limit the invention; the radius of curvature of the flange portion of the cap member may be the same as in the first embodiment described above.

Figure 38:
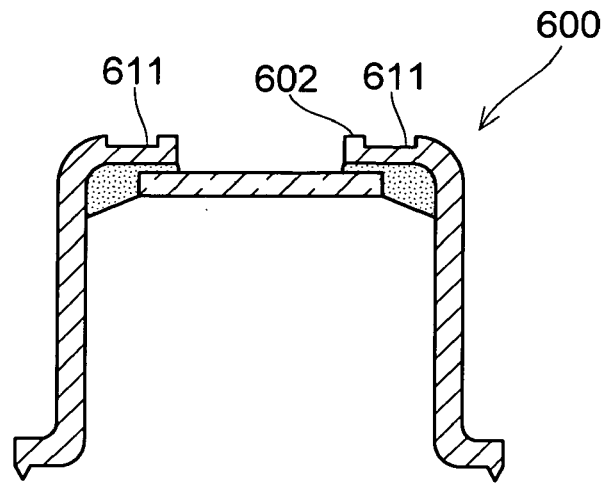
FIG. 38 is a sectional view of a cap member according to a first modified example of the invention.
Figure 47:
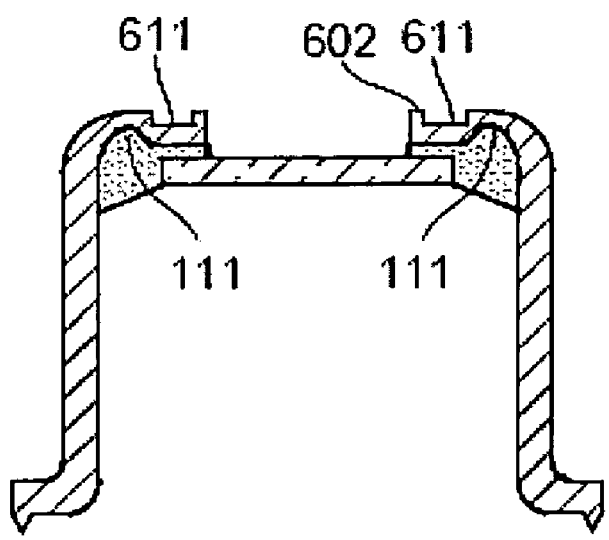
FIG. 47 is a sectional view of the cap member according to a seventh modified example of the invention.

Although the first and second embodiments described above deal with examples in which a groove portion is formed in the inner surface of the top face portion, this is not meant to limit the invention; for example, as in the cap member 600 shown in FIG. 38, a groove portion 611 may be formed on the outer surface of the top face portion 602. As shown in FIG. 47, it is possible even to form groove portions 611 and 111 on both the inner and outer surfaces of the top face portion.

Figure 39:
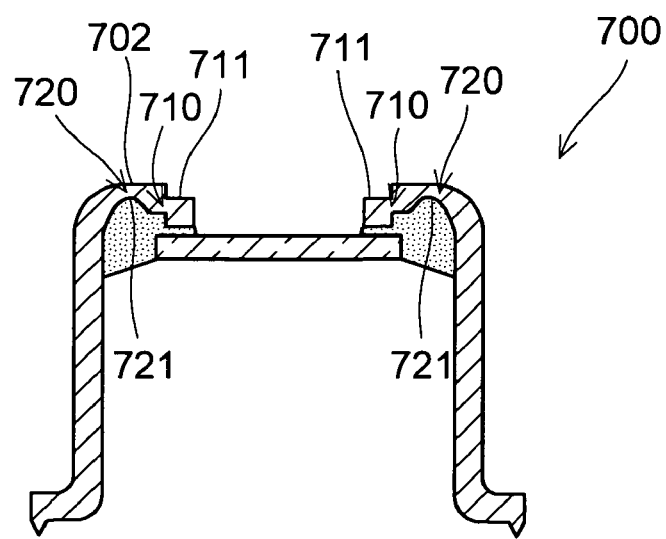
FIG. 39 is a sectional view of a cap member according to a second modified example of the invention.

Although the first to third embodiments described above deal with examples in which part of the top face portion at one place is formed to be less thick, this is not meant to limit the invention; for example, as in the cap member 700 shown in FIG. 39, by forming a step portion 711 and a groove portion 721 in the top face portion 702, parts 710 and 702 of the top face portion 702 at two places may be formed to be less thick. It is possible even to make parts of the top face portion at more than two places less thick.

Figure 40:
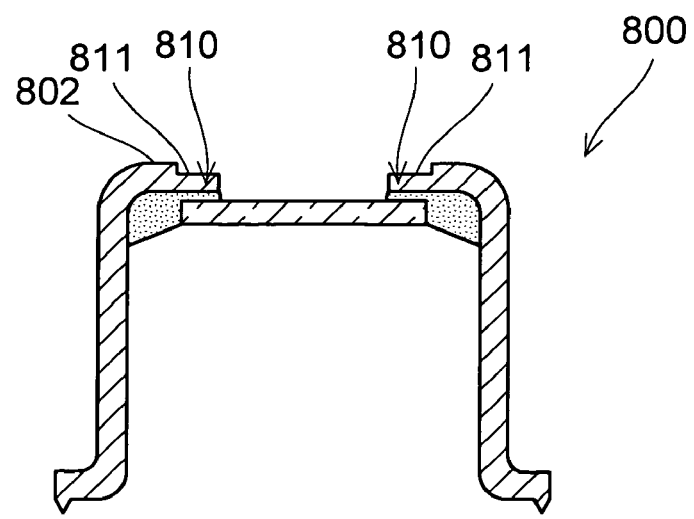
FIG. 40 is a sectional view of a cap member according to a third modified example of the invention.

It is also possible to form a step portion 811 as shown in FIG. 40 in the top face portion 802 of the cap member 800 to make part 810 of the top face portion 802 less thick.

Figure 41:
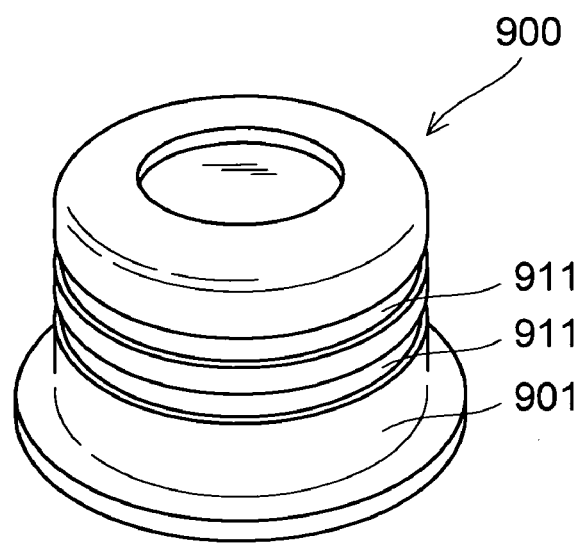
FIG. 41 is an overall perspective view of a cap member according to a fourth modified example of the invention.
Figure 42:
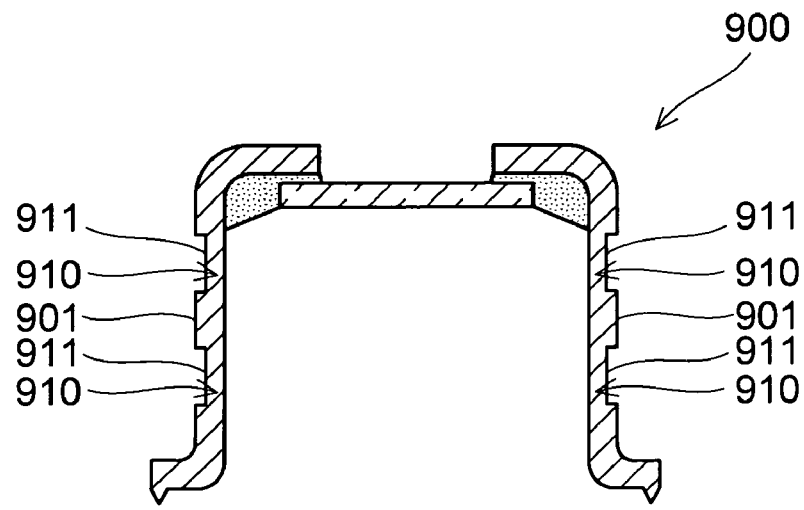
FIG. 42 is a sectional view of the cap member according to the fourth modified example of the invention.

Although the fourth embodiment described above deals with an example in which a groove portion is formed at one place in the side wall portion, this is not meant to limit the invention; for example, as in the cap member 900 shown in FIGS. 41 and 42, groove portions 911 may be formed at two places in the side wall portion 901. This permits parts 910 of the side wall portion 901 at two places to be formed less thick. It is possible even to form groove portions at more than two places in the side wall portion.

Although the fourth embodiment described above deals with an example in which a groove portion is formed on the outer surface of the side wall portion, this is not meant to limit the invention; a groove portion may be formed in the inner surface of the side wall portion.

Figure 43:
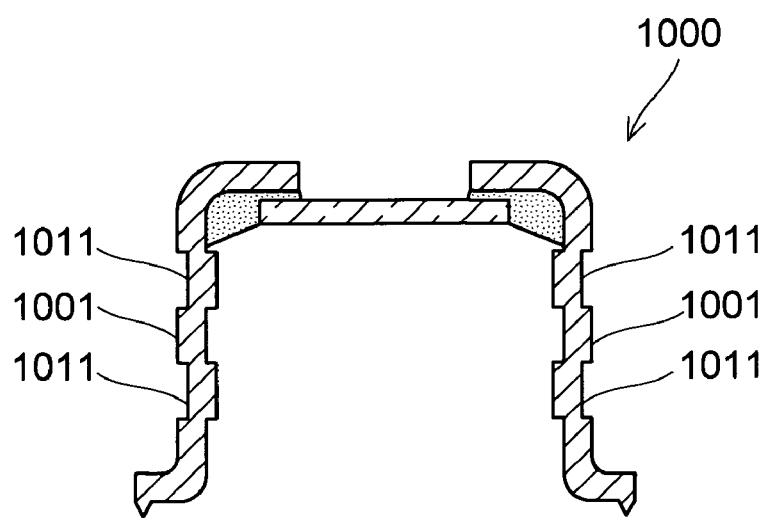
FIG. 43 is a sectional view of a cap member according to a fifth modified example of the invention.

Although the fifth embodiment described above deals with an example in which a step portion is formed at one place in the side wall portion, this is not meant to limit the invention; for example, as in the cap member 1000 shown in FIG. 43, step portions may be formed at two places in the side wall portion 1001. It is possible even to form step portions at more than two places in the side wall portion.

Figure 44:
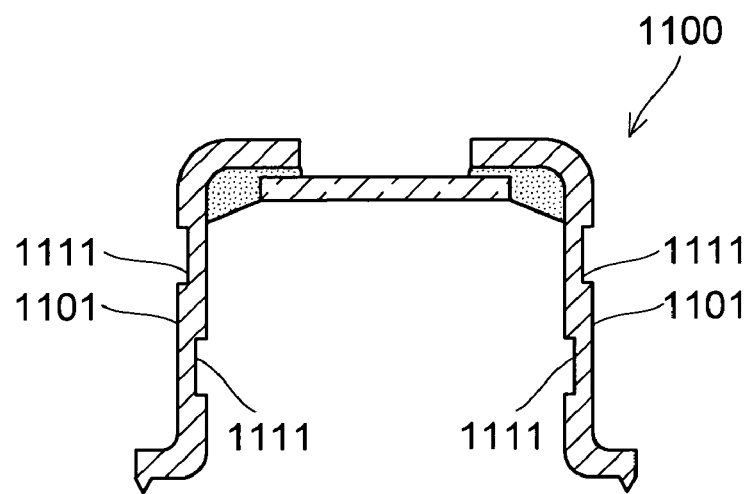
FIG. 44 is a sectional view of a cap member according to a sixth modified example of the invention.
Figure 45:
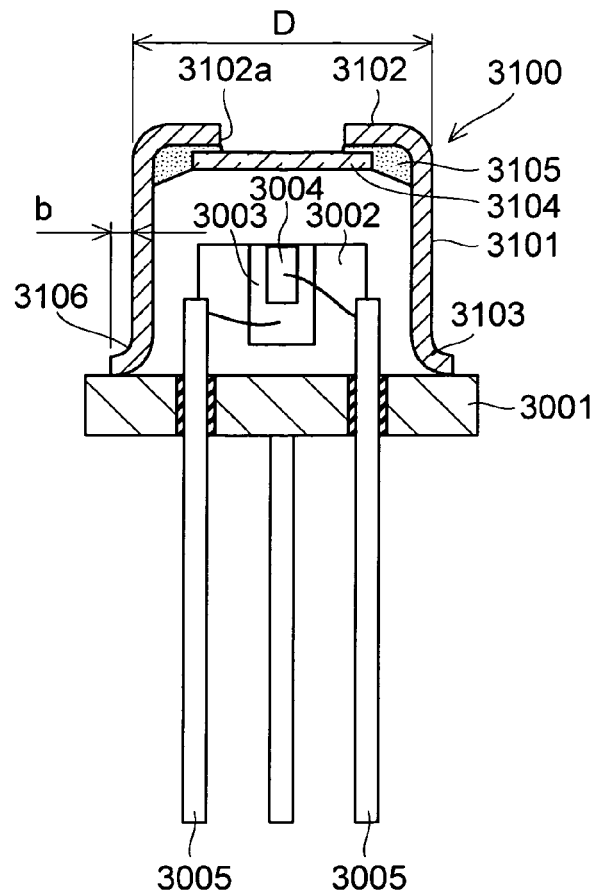
FIG. 45 is a sectional view illustrating a structure of a conventionally known can-package-type semiconductor laser device.
Figure 46:
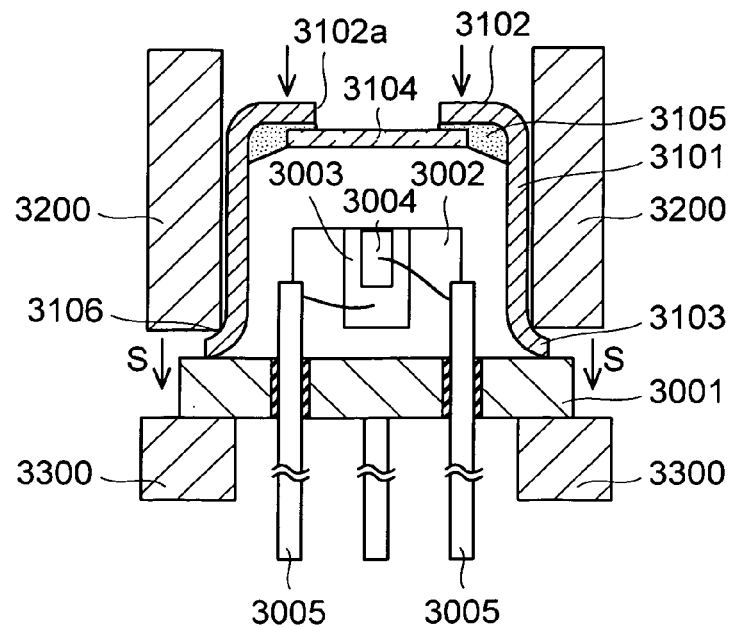
FIG. 46 is a sectional view illustrating a method for fixing a cap member on a stem in the conventionally known can-package-type semiconductor laser device shown in FIG. 45.

For example, as in the cap member 1100 shown in FIG. 44, groove portions 1111 may be formed in both the outer and inner surfaces of the side wall portion 1101. It is possible to form a groove portion and a step portion in the side wall portion, and it is possible to form a groove portion and/or a step portion in each of the top face portion and the side wall portion. With one of a variety of combinations of a groove portion and a step portion like these, it is possible to obtain a structure in which even if an external force is applied to the top face portion and also if an external force is applied to the side wall portion, the low-melting-point glass is less likely to break.

What is claimed is:

1. A semiconductor device, comprising:
    a semiconductor chip;
    a support base on which the semiconductor chip is mounted; and
    a cap member fixed on the support base so as to cover the semiconductor chip, the cap member including,
        a cylindrical side wall portion,
        a top face portion closing one end of the side wall portion and having an opening formed in a predetermined region therein,
        a light-transmissive window member fitted to the top face portion so as to stop the opening, and
        a fitting portion arranged at another end of the side wall portion and fixed on a support base on which a semiconductor chip is mounted,
    wherein at least one of the side wall portion and the top face portion has grooves formed in both of inner and outer surfaces thereof, the grooves forming a part, less thick than another part, of the at least one of the side wall portion and the top face portion.

2. The semiconductor device according to claim 1, wherein the top face portion has a first step portion formed in at least part of a rim portion of the opening, and
    the first step portion forms, in the top face portion, a part less thick than the other part of the at least one of the side wall portion and the top face portion.

3. The semiconductor device according to claim 2, wherein the opening in the top face portion is formed circular as seen in a plan view, and
    the first step portion is formed all around the rim portion of the opening.

4. The semiconductor device according to claim 1, wherein the grooves are formed in the top face portion.

5. The semiconductor device according to claim 4, wherein the grooves are formed circumferentially so as to surround the opening as seen in a plan view.

6. The semiconductor device according to claim 1, wherein a second step portion is formed in a predetermined region in the side wall portion, and
    the second step portion forms, in the side wall portion, a part less thick than the other part of the at least one of the side wall portion and the top face portion.

7. The semiconductor device according to claim 6, wherein the second step portion is formed so as to make one turn in a circumferential direction of the side wall portion.

8. The semiconductor device according to claim 6, wherein the second step portion is formed at two or more places in the side wall portion.

9. The semiconductor device according to claim 1, wherein the grooves are formed in the side wall portion.

10. The semiconductor device according to claim 9, wherein the grooves formed so as to make one turn in a circumferential direction of the side wall portion.

11. The semiconductor device according to claim 1, wherein
    the fitting portion is formed at the other end of the side wall portion integrally therewith, and has a projecting portion formed thereon, the projecting portion projecting toward the support base and pressed onto a upper face of the support base,
    the fitting portion is bent outward of the cylindrical side wall portion with a predetermined radius of curvature so that the fitting portion includes a flat-surfaced portion, and
    the projecting portion is formed on the flat-surfaced portion.

12. The semiconductor device according to claim 11, wherein the projecting portion is formed on the fitting portion, in an end portion thereof opposite from the side wall portion.

13. The semiconductor device according to claim 1, wherein as a result of the cap member being fixed on the support base, the semiconductor chip is airtightly sealed in the cap member.

14. The semiconductor device according to claim 1, wherein the semiconductor chip is a nitride-based semiconductor laser chip.

15. The semiconductor device according to claim 1, wherein the support base is substantially circular as seen in a plan view, and
    the support base has a diameter of 3.8 mm or less.

* * * * *